(12) United States Patent
Neudecker

(10) Patent No.: US 8,268,488 B2
(45) Date of Patent: Sep. 18, 2012

(54) THIN FILM ELECTROLYTE FOR THIN FILM BATTERIES

(75) Inventor: Bernd J. Neudecker, Littleton, CO (US)

(73) Assignee: Infinite Power Solutions, Inc., Littleton, CO (US)

( * ) Notice: Subject to any disclaimer, the term of this patent is extended or adjusted under 35 U.S.C. 154(b) by 795 days.

(21) Appl. No.: 12/358,762

(22) Filed: Jan. 23, 2009

(65) Prior Publication Data
US 2009/0162755 A1  Jun. 25, 2009

Related U.S. Application Data

(63) Continuation-in-part of application No. 12/339,361, filed on Dec. 19, 2008.

(60) Provisional application No. 61/022,904, filed on Jan. 23, 2008, provisional application No. 61/016,038, filed on Dec. 21, 2007.

(51) Int. Cl.
*H01M 10/0562* (2010.01)

(52) U.S. Cl. ....................................... 429/322

(58) Field of Classification Search ............. 429/319
See application file for complete search history.

(56) References Cited

U.S. PATENT DOCUMENTS

| | | |
|---|---|---|
| 712,316 A | 10/1902 | Loppe et al. |
| 2,970,180 A | 1/1961 | Urry |
| 3,309,302 A | 3/1967 | Heil |
| 3,616,403 A | 10/1971 | Collins et al. |
| 3,790,432 A | 2/1974 | Fletcher et al. |
| 3,797,091 A | 3/1974 | Gavin |
| 3,850,604 A | 11/1974 | Klein |
| 3,939,008 A | 2/1976 | Longo et al. |
| 4,082,569 A | 4/1978 | Evans, Jr. |
| 4,111,523 A | 9/1978 | Kaminow et al. |
| 4,127,424 A | 11/1978 | Ullery, Jr. |
| 4,226,924 A | 10/1980 | Kimura et al. |
| 4,283,216 A | 8/1981 | Brereton |
| 4,318,938 A | 3/1982 | Barnett et al. |
| 4,328,297 A | 5/1982 | Bilhorn |
| 4,437,966 A | 3/1984 | Hope et al. |
| 4,442,144 A | 4/1984 | Pipkin |
| 4,467,236 A | 8/1984 | Kolm et al. |
| 4,481,265 A | 11/1984 | Ezawa et al. |
| 4,518,661 A | 5/1985 | Rippere |
| 4,555,456 A | 11/1985 | Kanehori et al. |
| 4,572,873 A | 2/1986 | Kanehori et al. |
| 4,587,225 A | 5/1986 | Tsukuma et al. |
| 4,619,680 A | 10/1986 | Nourshargh et al. |
| 4,645,726 A | 2/1987 | Hiratani et al. |
| 4,664,993 A | 5/1987 | Sturgis et al. |
| 4,668,593 A | 5/1987 | Sammells |
| RE32,449 E | 6/1987 | Claussen |
| 4,672,586 A | 6/1987 | Shimohigashi et al. |
| 4,710,940 A | 12/1987 | Sipes, Jr. |
| 4,728,588 A | 3/1988 | Noding et al. |
| 4,740,431 A | 4/1988 | Little |
| 4,756,717 A | 7/1988 | Sturgis et al. |
| 4,785,459 A | 11/1988 | Baer |
| 4,826,743 A | 5/1989 | Nazri |
| 4,865,428 A | 9/1989 | Corrigan |
| 4,878,094 A | 10/1989 | Balkanski |
| 4,903,326 A | 2/1990 | Zakman et al. |
| 4,915,810 A | 4/1990 | Kestigian et al. |
| 4,964,877 A | 10/1990 | Keister et al. |
| 4,977,007 A | 12/1990 | Kondo et al. |
| 4,978,437 A | 12/1990 | Wirz |
| 5,006,737 A | 4/1991 | Fay |
| 5,019,467 A | 5/1991 | Fujiwara |
| 5,030,331 A | 7/1991 | Sato |
| 5,035,965 A | 7/1991 | Sangyoji et al. |
| 5,055,704 A | 10/1991 | Link et al. |
| 5,057,385 A | 10/1991 | Hope et al. |
| 5,085,904 A | 2/1992 | Deak et al. |
| 5,096,852 A | 3/1992 | Hobson |
| 5,100,821 A | 3/1992 | Fay |
| 5,107,538 A | 4/1992 | Benton et al. |
| 5,110,694 A | 5/1992 | Nagasubramanian et al. |
| 5,110,696 A | 5/1992 | Shokoohi et al. |
| 5,119,269 A | 6/1992 | Nakayama |

(Continued)

FOREIGN PATENT DOCUMENTS

CN   1415124   4/2003

(Continued)

OTHER PUBLICATIONS

Affinito, J.D. et al., "PML/oxide/PML barrier layer performance differences arising from use of UV or electron beam polymerization of the PML layers," Thin Solid Films 308-309: 19-25 (1997).

Affinito, J.D. et al., "Polymer-oxide transparent barrier layers," Society of Vacuum Coaters, 39th Ann. Technical Conference Proceedings, May 5-10, 1996, Philadelphia, PA, pp. 392-397 (1996).

Alder, T. et al., "High-efficiency fiber-to-chip coupling using low-loss tapered single-mode fiber," IEEE Photonics Tech. Lett. 12(8): 1016-1018 (2000).

Almeida, V.R. et al., "Nanotaper for compact mode conversion," Optics Letters 28(15): 1302-1304 (2003).

Anh et al., "Significant Suppression of Leakage Current in $(Ba,Sr)TiO_3$ Thin Films by Ni or Mn Doping," J. Appl. Phys.,92(5): 2651-2654 (Sep. 2002).

Asghari, M. and Dawnay, E., "ASOC™—a manufacturing integrated optics technology," SPIE 3620: 252-262 (Jan. 1999).

(Continued)

*Primary Examiner* — Patrick Ryan
*Assistant Examiner* — Wyatt McConnell
(74) *Attorney, Agent, or Firm* — Fox Rothschild LLP; Jeff E. Schwartz

(57) ABSTRACT

The invention relates to a solid-state lithium-ion thin-film electrolyte that, compared to the current state-of-the-art thin-film electrolyte, Lipon, exhibits an equal or larger electrochemical stability window (0-5.5 V vs. $Li^+/Li$), an equal or smaller electronic conductivity ($10^{-14}$ S/cm at 25° C.), the same ideal transference number for $Li^+$ ions (t=1.000), and a 10× higher $Li^+$ ion conductivity at −40° C. Latter provides thin-film batteries (TFBs) with at least a 5× higher power performance at −40° C. over the current state-of-the-art Lipon TFBs.

22 Claims, No Drawings

U.S. PATENT DOCUMENTS

| | | | |
|---|---|---|---|
| 5,119,460 A | 6/1992 | Bruce et al. | |
| 5,124,782 A | 6/1992 | Hundt et al. | |
| 5,147,985 A | 9/1992 | DuBrucq | |
| 5,153,710 A | 10/1992 | McCain | |
| 5,169,408 A | 12/1992 | Biggerstaff et al. | |
| 5,171,413 A | 12/1992 | Arntz et al. | |
| 5,173,271 A | 12/1992 | Chen et al. | |
| 5,174,876 A | 12/1992 | Buchal et al. | |
| 5,180,645 A | 1/1993 | Moré | |
| 5,187,564 A | 2/1993 | McCain | |
| 5,196,041 A | 3/1993 | Tumminelli et al. | |
| 5,196,374 A | 3/1993 | Hundt et al. | |
| 5,200,029 A | 4/1993 | Bruce et al. | |
| 5,202,201 A | 4/1993 | Meunier et al. | |
| 5,206,925 A | 4/1993 | Nakazawa et al. | |
| 5,208,121 A | 5/1993 | Yahnke et al. | |
| 5,217,828 A | 6/1993 | Sangyoji et al. | |
| 5,221,891 A | 6/1993 | Janda et al. | |
| 5,225,288 A | 7/1993 | Beeson et al. | |
| 5,227,264 A | 7/1993 | Duval et al. | |
| 5,237,439 A | 8/1993 | Misono et al. | |
| 5,252,194 A | 10/1993 | Demaray et al. | |
| 5,262,254 A | 11/1993 | Koksbang et al. | |
| 5,273,608 A | 12/1993 | Nath | |
| 5,287,427 A | 2/1994 | Atkins et al. | |
| 5,296,089 A | 3/1994 | Chen et al. | |
| 5,300,461 A | 4/1994 | Ting | |
| 5,303,319 A | 4/1994 | Ford et al. | |
| 5,306,569 A | 4/1994 | Hiraki | |
| 5,307,240 A | 4/1994 | McMahon | |
| 5,309,302 A | 5/1994 | Vollmann | |
| 5,314,765 A | 5/1994 | Bates | |
| 5,326,652 A | 7/1994 | Lake | |
| 5,326,653 A | 7/1994 | Chang | |
| 5,338,624 A | 8/1994 | Gruenstern et al. | |
| 5,338,625 A | 8/1994 | Bates et al. | |
| 5,342,709 A | 8/1994 | Yahnke et al. | |
| 5,355,089 A | 10/1994 | Treger et al. | |
| 5,360,686 A | 11/1994 | Peled et al. | |
| 5,362,579 A | 11/1994 | Rossoll et al. | |
| 5,381,262 A | 1/1995 | Arima et al. | |
| 5,387,482 A | 2/1995 | Anani | |
| 5,401,595 A | 3/1995 | Kagawa et al. | |
| 5,403,680 A | 4/1995 | Otagawa et al. | |
| 5,411,537 A | 5/1995 | Munshi et al. | |
| 5,411,592 A | 5/1995 | Ovshinsky et al. | |
| 5,419,982 A | 5/1995 | Tura et al. | |
| 5,427,669 A | 6/1995 | Drummond | |
| 5,435,826 A | 7/1995 | Sakakibara et al. | |
| 5,437,692 A | 8/1995 | Dasgupta et al. | |
| 5,445,856 A | 8/1995 | Chaloner-Gill | |
| 5,445,906 A | 8/1995 | Hobson et al. | |
| 5,448,110 A | 9/1995 | Tuttle et al. | |
| 5,449,576 A | 9/1995 | Anani | |
| 5,455,126 A | 10/1995 | Bates et al. | |
| 5,457,569 A | 10/1995 | Liou et al. | |
| 5,458,995 A | 10/1995 | Behl et al. | |
| 5,464,692 A | 11/1995 | Huber | |
| 5,464,706 A | 11/1995 | Dasgupta et al. | |
| 5,470,396 A | 11/1995 | Mongon et al. | |
| 5,472,795 A | 12/1995 | Atita | |
| 5,475,528 A | 12/1995 | LaBorde | |
| 5,478,456 A | 12/1995 | Humpal et al. | |
| 5,483,613 A | 1/1996 | Bruce et al. | |
| 5,493,177 A | 2/1996 | Muller et al. | |
| 5,498,489 A | 3/1996 | Dasgupta et al. | |
| 5,499,207 A | 3/1996 | Miki et al. | |
| 5,501,918 A | 3/1996 | Gruenstern et al. | |
| 5,504,041 A | 4/1996 | Summerfelt | |
| 5,512,147 A | 4/1996 | Bates et al. | |
| 5,512,387 A | 4/1996 | Ovshinsky | |
| 5,512,389 A | 4/1996 | Dasgupta et al. | |
| 5,538,796 A | 7/1996 | Schaffer et al. | |
| 5,540,742 A | 7/1996 | Sangyoji et al. | |
| 5,547,780 A | 8/1996 | Kagawa et al. | |
| 5,547,782 A | 8/1996 | Dasgupta et al. | |
| 5,552,242 A | 9/1996 | Ovshinsky et al. | |
| 5,555,127 A | 9/1996 | Abdelkader et al. | |
| 5,561,004 A | 10/1996 | Bates et al. | |
| 5,563,979 A | 10/1996 | Bruce et al. | |
| 5,565,071 A | 10/1996 | Demaray et al. | |
| 5,567,210 A | 10/1996 | Bates et al. | |
| 5,569,520 A | 10/1996 | Bates | |
| 5,582,935 A | 12/1996 | Dasgupta et al. | |
| 5,591,520 A | 1/1997 | Migliorini et al. | |
| 5,597,660 A * | 1/1997 | Bates et al. | 429/322 |
| 5,597,661 A | 1/1997 | Takeuchi et al. | |
| 5,599,355 A | 2/1997 | Nagasubramanian et al. | |
| 5,601,952 A | 2/1997 | Dasgupta et al. | |
| 5,603,816 A | 2/1997 | Demaray et al. | |
| 5,607,560 A | 3/1997 | Hirabayashi et al. | |
| 5,607,789 A | 3/1997 | Treger et al. | |
| 5,612,152 A | 3/1997 | Bates et al. | |
| 5,612,153 A | 3/1997 | Moulton et al. | |
| 5,613,995 A | 3/1997 | Bhandarkar et al. | |
| 5,616,933 A | 4/1997 | Li | |
| 5,618,382 A | 4/1997 | Mintz et al. | |
| 5,625,202 A | 4/1997 | Chai | |
| 5,637,418 A | 6/1997 | Brown et al. | |
| 5,643,480 A | 7/1997 | Gustavsson et al. | |
| 5,644,207 A | 7/1997 | Lew et al. | |
| 5,645,626 A | 7/1997 | Edlund et al. | |
| 5,645,960 A | 7/1997 | Scrosati et al. | |
| 5,654,054 A | 8/1997 | Tropsha et al. | |
| 5,654,984 A | 8/1997 | Hershbarger et al. | |
| 5,658,652 A | 8/1997 | Sellergren | |
| 5,660,700 A | 8/1997 | Shimizu et al. | |
| 5,665,490 A | 9/1997 | Takeuchi et al. | |
| 5,667,538 A | 9/1997 | Bailey | |
| 5,677,784 A | 10/1997 | Harris | |
| 5,679,980 A | 10/1997 | Summerfelt | |
| 5,681,666 A | 10/1997 | Treger et al. | |
| 5,686,360 A | 11/1997 | Harvey, III et al. | |
| 5,689,522 A | 11/1997 | Beach | |
| 5,693,956 A | 12/1997 | Shi et al. | |
| 5,702,829 A | 12/1997 | Paidassi et al. | |
| 5,705,293 A | 1/1998 | Hobson | |
| 5,716,728 A | 2/1998 | Smesko | |
| 5,718,813 A | 2/1998 | Drummond et al. | |
| 5,719,976 A | 2/1998 | Henry et al. | |
| 5,721,067 A | 2/1998 | Jacobs et al. | |
| RE35,746 E | 3/1998 | Lake | |
| 5,731,661 A | 3/1998 | So et al. | |
| 5,738,731 A | 4/1998 | Shindo et al. | |
| 5,742,094 A | 4/1998 | Ting | |
| 5,755,938 A | 5/1998 | Fukui et al. | |
| 5,755,940 A | 5/1998 | Shindo | |
| 5,757,126 A | 5/1998 | Harvey, III et al. | |
| 5,762,768 A | 6/1998 | Goy et al. | |
| 5,763,058 A | 6/1998 | Isen et al. | |
| 5,771,562 A | 6/1998 | Harvey, III et al. | |
| 5,776,278 A | 7/1998 | Tuttle et al. | |
| 5,779,839 A | 7/1998 | Tuttle et al. | |
| 5,790,489 A | 8/1998 | O'Connor | |
| 5,792,550 A | 8/1998 | Phillips et al. | |
| 5,805,223 A | 9/1998 | Shikakura et al. | |
| 5,811,177 A | 9/1998 | Shi et al. | |
| 5,814,195 A | 9/1998 | Lehan et al. | |
| 5,830,330 A | 11/1998 | Lantsman | |
| 5,831,262 A | 11/1998 | Greywall et al. | |
| 5,834,137 A | 11/1998 | Zhang et al. | |
| 5,841,931 A | 11/1998 | Foresi et al. | |
| 5,842,118 A | 11/1998 | Wood, Jr. | |
| 5,845,990 A | 12/1998 | Hymer | |
| 5,847,865 A | 12/1998 | Gopinath et al. | |
| 5,849,163 A | 12/1998 | Ichikawa et al. | |
| 5,851,896 A | 12/1998 | Summerfelt | |
| 5,853,830 A | 12/1998 | McCaulley et al. | |
| 5,855,744 A | 1/1999 | Halsey et al. | |
| 5,856,705 A | 1/1999 | Ting | |
| 5,864,182 A | 1/1999 | Matsuzaki | |
| 5,865,860 A | 2/1999 | Delnick | |
| 5,870,273 A | 2/1999 | Sogabe et al. | |
| 5,874,184 A | 2/1999 | Takeuchi et al. | |
| 5,882,721 A | 3/1999 | Delnick | |
| 5,882,946 A | 3/1999 | Otani | |
| 5,889,383 A | 3/1999 | Teich | |

| | | | | | | |
|---|---|---|---|---|---|---|
| 5,895,731 | A | 4/1999 | Clingempeel | 6,176,986 B1 | 1/2001 | Watanabe et al. |
| 5,897,522 | A | 4/1999 | Nitzan | 6,181,283 B1 | 1/2001 | Johnson et al. |
| 5,900,057 | A | 5/1999 | Buchal et al. | 6,192,222 B1 | 2/2001 | Greeff et al. |
| 5,909,346 | A | 6/1999 | Malhotra et al. | 6,197,167 B1 | 3/2001 | Tanaka |
| 5,916,704 | A | 6/1999 | Lewin et al. | 6,198,217 B1 | 3/2001 | Suzuki et al. |
| 5,923,964 | A | 7/1999 | Li | 6,204,111 B1 | 3/2001 | Uemoto et al. |
| 5,930,046 | A | 7/1999 | Solberg et al. | 6,210,544 B1 | 4/2001 | Sasaki |
| 5,930,584 | A | 7/1999 | Sun et al. | 6,210,832 B1 | 4/2001 | Visco et al. |
| 5,942,089 | A | 8/1999 | Sproul et al. | 6,214,061 B1 | 4/2001 | Visco et al. |
| 5,948,215 | A | 9/1999 | Lantsmann | 6,214,660 B1 | 4/2001 | Uemoto et al. |
| 5,948,464 | A | 9/1999 | Delnick | 6,218,049 B1 | 4/2001 | Bates et al. |
| 5,948,562 | A | 9/1999 | Fulcher et al. | 6,220,516 B1 | 4/2001 | Tuttle et al. |
| 5,952,778 | A | 9/1999 | Haskal et al. | 6,223,317 B1 | 4/2001 | Pax et al. |
| 5,955,217 | A | 9/1999 | Lerberghe | 6,228,532 B1 | 5/2001 | Tsuji et al. |
| 5,961,672 | A | 10/1999 | Skotheim et al. | 6,229,987 B1 | 5/2001 | Greeff et al. |
| 5,961,682 | A | 10/1999 | Lee et al. | 6,232,242 B1 | 5/2001 | Hata et al. |
| 5,966,491 | A | 10/1999 | DiGiovanni | 6,235,432 B1 | 5/2001 | Kono et al. |
| 5,970,393 | A | 10/1999 | Khorrami et al. | 6,236,793 B1 | 5/2001 | Lawrence et al. |
| 5,973,913 | A | 10/1999 | McEwen et al. | 6,242,128 B1 | 6/2001 | Tura et al. |
| 5,977,582 | A | 11/1999 | Flemming et al. | 6,242,129 B1 | 6/2001 | Johnson |
| 5,982,144 | A | 11/1999 | Johnson et al. | 6,242,132 B1 | 6/2001 | Neudecker et al. |
| 5,985,484 | A | 11/1999 | Young et al. | 6,248,291 B1 | 6/2001 | Nakagama et al. |
| 5,985,485 | A | 11/1999 | Ovshinsky et al. | 6,248,481 B1 | 6/2001 | Visco et al. |
| 6,000,603 | A | 12/1999 | Koskenmaki et al. | 6,248,640 B1 | 6/2001 | Nam |
| 6,001,224 | A | 12/1999 | Drummond et al. | 6,249,222 B1 | 6/2001 | Gehlot |
| 6,004,660 | A | 12/1999 | Topolski et al. | 6,252,564 B1 | 6/2001 | Albert et al. |
| 6,007,945 | A | 12/1999 | Jacobs et al. | 6,258,252 B1 | 7/2001 | Miyasaka et al. |
| 6,013,949 | A | 1/2000 | Tuttle | 6,261,917 B1 | 7/2001 | Quek et al. |
| 6,019,284 | A | 2/2000 | Freeman et al. | 6,264,709 B1 | 7/2001 | Yoon et al. |
| 6,023,610 | A | 2/2000 | Wood, Jr. | 6,265,652 B1 | 7/2001 | Kurata et al. |
| 6,024,844 | A | 2/2000 | Drummond et al. | 6,268,695 B1 | 7/2001 | Affinito |
| 6,025,094 | A | 2/2000 | Visco et al. | 6,271,053 B1 | 8/2001 | Kondo |
| 6,028,990 | A | 2/2000 | Shahani et al. | 6,271,793 B1 | 8/2001 | Brady et al. |
| 6,030,421 | A | 2/2000 | Gauthier et al. | 6,271,801 B2 | 8/2001 | Tuttle et al. |
| 6,033,768 | A | 3/2000 | Muenz et al. | 6,280,585 B1 | 8/2001 | Obinata |
| 6,042,965 | A | 3/2000 | Nestler et al. | 6,280,875 B1 | 8/2001 | Kwak et al. |
| 6,045,626 | A | 4/2000 | Yano et al. | 6,281,142 B1 | 8/2001 | Basceri |
| 6,045,652 | A | 4/2000 | Tuttle et al. | 6,284,406 B1 | 9/2001 | Xing et al. |
| 6,045,942 | A | 4/2000 | Miekka et al. | 6,287,986 B1 | 9/2001 | Mihara |
| 6,046,081 | A | 4/2000 | Kuo | 6,289,209 B1 | 9/2001 | Wood, Jr. |
| 6,046,514 | A | 4/2000 | Rouillard et al. | 6,290,821 B1 | 9/2001 | McLeod |
| 6,048,372 | A | 4/2000 | Mangahara et al. | 6,290,822 B1 | 9/2001 | Fleming et al. |
| 6,051,114 | A | 4/2000 | Yao et al. | 6,291,098 B1 | 9/2001 | Shibuya et al. |
| 6,051,296 | A | 4/2000 | McCaulley et al. | 6,294,722 B1 | 9/2001 | Kondo et al. |
| 6,052,397 | A | 4/2000 | Jeon et al. | 6,296,949 B1 | 10/2001 | Bergstresser et al. |
| 6,057,557 | A | 5/2000 | Ichikawa | 6,296,967 B1 | 10/2001 | Jacobs et al. |
| 6,058,233 | A | 5/2000 | Dragone | 6,296,971 B1 | 10/2001 | Hara |
| 6,071,323 | A | 6/2000 | Kawaguchi | 6,300,215 B1 | 10/2001 | Shin |
| 6,075,973 | A | 6/2000 | Greeff et al. | 6,302,939 B1 | 10/2001 | Rabin |
| 6,077,106 | A | 6/2000 | Mish | 6,306,265 B1 | 10/2001 | Fu et al. |
| 6,077,642 | A | 6/2000 | Ogata et al. | 6,316,563 B2 | 11/2001 | Naijo et al. |
| 6,078,791 | A | 6/2000 | Tuttle et al. | 6,323,416 B1 | 11/2001 | Komori et al. |
| 6,080,508 | A | 6/2000 | Dasgupta et al. | 6,324,211 B1 | 11/2001 | Ovard et al. |
| 6,080,643 | A | 6/2000 | Noguchi et al. | 6,325,294 B2 | 12/2001 | Tuttle et al. |
| 6,093,944 | A | 7/2000 | VanDover | 6,329,213 B1 | 12/2001 | Tuttle et al. |
| 6,094,292 | A | 7/2000 | Goldner et al. | 6,339,236 B1 | 1/2002 | Tomii et al. |
| 6,096,569 | A | 8/2000 | Matsuno et al. | 6,340,880 B1 | 1/2002 | Higashijima et al. |
| 6,100,108 | A | 8/2000 | Mizuno et al. | 6,344,366 B1 | 2/2002 | Bates |
| 6,106,933 | A | 8/2000 | Nagai et al. | 6,344,419 B1 | 2/2002 | Forster et al. |
| 6,110,531 | A | 8/2000 | Paz De Araujo | 6,344,795 B1 | 2/2002 | Gehlot |
| 6,115,616 | A | 9/2000 | Halperin et al. | 6,350,353 B2 | 2/2002 | Gopalraja et al. |
| 6,117,279 | A | 9/2000 | Smolanoff et al. | 6,351,630 B2 | 2/2002 | Wood, Jr. |
| 6,118,426 | A | 9/2000 | Albert et al. | 6,356,230 B1 | 3/2002 | Greeff et al. |
| 6,120,890 | A | 9/2000 | Chen et al. | 6,356,694 B1 | 3/2002 | Weber |
| 6,129,277 | A | 10/2000 | Grant et al. | 6,356,764 B1 | 3/2002 | Ovard et al. |
| 6,133,670 | A | 10/2000 | Rodgers et al. | 6,358,810 B1 | 3/2002 | Dornfest et al. |
| 6,137,671 | A | 10/2000 | Staffiere | 6,360,954 B1 | 3/2002 | Barnardo |
| 6,144,916 | A | 11/2000 | Wood, Jr. et al. | 6,361,662 B1 | 3/2002 | Chiba et al. |
| 6,146,225 | A | 11/2000 | Sheats et al. | 6,365,300 B1 | 4/2002 | Ota et al. |
| 6,148,503 | A | 11/2000 | Delnick et al. | 6,365,319 B1 | 4/2002 | Heath et al. |
| 6,156,452 | A | 12/2000 | Kozuki et al. | 6,368,275 B1 | 4/2002 | Sliwa et al. |
| 6,157,765 | A | 12/2000 | Bruce et al. | 6,369,316 B1 | 4/2002 | Plessing et al. |
| 6,159,635 | A | 12/2000 | Dasgupta et al. | 6,372,383 B1 | 4/2002 | Lee et al. |
| 6,160,373 | A | 12/2000 | Dunn et al. | 6,372,386 B1 | 4/2002 | Cho et al. |
| 6,162,709 | A | 12/2000 | Raoux et al. | 6,373,224 B1 | 4/2002 | Goto et al. |
| 6,165,566 | A | 12/2000 | Tropsha | 6,375,780 B1 | 4/2002 | Tuttle et al. |
| 6,168,884 | B1 | 1/2001 | Neudecker et al. | 6,376,027 B1 | 4/2002 | Lee et al. |
| 6,169,474 | B1 | 1/2001 | Greeff et al. | 6,379,835 B1 | 4/2002 | Kucherovsky et al. |
| 6,175,075 | B1 | 1/2001 | Shiotsuka et al. | 6,379,842 B1 | 4/2002 | Mayer |

| Patent | Date | Inventor |
|---|---|---|
| 6,379,846 B1 | 4/2002 | Terahara et al. |
| 6,380,477 B1 | 4/2002 | Curtin |
| 6,384,573 B1 | 5/2002 | Dunn |
| 6,387,563 B1 | 5/2002 | Bates |
| 6,391,166 B1 | 5/2002 | Wang |
| 6,392,565 B1 | 5/2002 | Brown |
| 6,394,598 B1 | 5/2002 | Kaiser |
| 6,395,430 B1 | 5/2002 | Cho et al. |
| 6,396,001 B1 | 5/2002 | Nakamura |
| 6,398,824 B1 | 6/2002 | Johnson |
| 6,399,241 B1 | 6/2002 | Hara et al. |
| 6,402,039 B1 | 6/2002 | Freeman et al. |
| 6,402,795 B1 | 6/2002 | Chu et al. |
| 6,402,796 B1 | 6/2002 | Johnson |
| 6,409,965 B1 | 6/2002 | Nagata et al. |
| 6,413,284 B1 | 7/2002 | Chu et al. |
| 6,413,285 B1 | 7/2002 | Chu et al. |
| 6,413,382 B1 | 7/2002 | Wang et al. |
| 6,413,645 B1 | 7/2002 | Graff et al. |
| 6,413,676 B1 | 7/2002 | Munshi |
| 6,414,626 B1 | 7/2002 | Greeff et al. |
| 6,416,598 B1 | 7/2002 | Sircar |
| 6,420,961 B1 | 7/2002 | Bates et al. |
| 6,422,698 B2 | 7/2002 | Kaiser |
| 6,423,106 B1 | 7/2002 | Bates |
| 6,423,776 B1 | 7/2002 | Akkapeddi et al. |
| 6,426,163 B1 | 7/2002 | Pasquier et al. |
| 6,432,577 B1 | 8/2002 | Shul et al. |
| 6,432,584 B1 | 8/2002 | Visco et al. |
| 6,433,380 B2 | 8/2002 | Shin |
| 6,433,465 B1 | 8/2002 | McKnight et al. |
| 6,436,156 B1 | 8/2002 | Wandeloski et al. |
| 6,437,231 B2 | 8/2002 | Kurata et al. |
| 6,444,336 B1 | 9/2002 | Jia et al. |
| 6,444,355 B1 | 9/2002 | Murai et al. |
| 6,444,368 B1 | 9/2002 | Hikmet et al. |
| 6,444,750 B1 | 9/2002 | Touhsaent |
| 6,459,418 B1 | 10/2002 | Comiskey et al. |
| 6,459,726 B1 | 10/2002 | Ovard et al. |
| 6,466,771 B2 | 10/2002 | Wood, Jr. |
| 6,475,668 B1 | 11/2002 | Hosokawa et al. |
| 6,481,623 B1 | 11/2002 | Grant et al. |
| 6,488,822 B1 | 12/2002 | Moslehi |
| 6,494,999 B1 | 12/2002 | Herrera et al. |
| 6,495,283 B1 | 12/2002 | Yoon et al. |
| 6,497,598 B2 | 12/2002 | Affinito |
| 6,500,287 B1 | 12/2002 | Azens et al. |
| 6,503,661 B1 | 1/2003 | Park et al. |
| 6,503,831 B2 | 1/2003 | Speakman |
| 6,506,289 B2 | 1/2003 | Demaray et al. |
| 6,511,516 B1 | 1/2003 | Johnson et al. |
| 6,511,615 B1 | 1/2003 | Dawes et al. |
| 6,517,968 B2 | 2/2003 | Johnson et al. |
| 6,522,067 B1 | 2/2003 | Graff et al. |
| 6,524,466 B1 | 2/2003 | Bonaventura et al. |
| 6,524,750 B1 | 2/2003 | Mansuetto |
| 6,525,976 B1 | 2/2003 | Johnson |
| 6,528,212 B1 | 3/2003 | Kusumoto et al. |
| 6,529,827 B1 | 3/2003 | Beason et al. |
| 6,533,907 B2 | 3/2003 | Demaray et al. |
| 6,537,428 B1 | 3/2003 | Xiong et al. |
| 6,538,211 B2 | 3/2003 | St. Lawrence et al. |
| 6,541,147 B1 | 4/2003 | McLean et al. |
| 6,548,912 B1 | 4/2003 | Graff et al. |
| 6,551,745 B2 | 4/2003 | Moutsios et al. |
| 6,558,836 B1 | 5/2003 | Whitacre et al. |
| 6,562,513 B1 | 5/2003 | Takeuchi et al. |
| 6,563,998 B1 | 5/2003 | Farah et al. |
| 6,569,564 B1 | 5/2003 | Lane |
| 6,569,570 B2 | 5/2003 | Sonobe et al. |
| 6,570,325 B2 | 5/2003 | Graff et al. |
| 6,572,173 B2 | 6/2003 | Muller |
| 6,573,652 B1 | 6/2003 | Graff et al. |
| 6,576,546 B2 | 6/2003 | Gilbert et al. |
| 6,579,728 B2 | 6/2003 | Grant et al. |
| 6,582,480 B2 | 6/2003 | Pasquier et al. |
| 6,582,481 B1 | 6/2003 | Erbil |
| 6,582,852 B1 | 6/2003 | Gao et al. |
| 6,589,299 B2 | 7/2003 | Missling et al. |
| 6,593,150 B2 | 7/2003 | Ramberg et al. |
| 6,599,662 B1 | 7/2003 | Chiang et al. |
| 6,600,905 B2 | 7/2003 | Greeff et al. |
| 6,602,338 B2 | 8/2003 | Chen et al. |
| 6,603,139 B1 | 8/2003 | Tessler et al. |
| 6,603,391 B1 | 8/2003 | Greeff et al. |
| 6,605,228 B1 | 8/2003 | Kawaguchi et al. |
| 6,608,464 B1 | 8/2003 | Lew et al. |
| 6,608,470 B1 | 8/2003 | Oglesbee et al. |
| 6,610,440 B1 | 8/2003 | LaFollette et al. |
| 6,615,614 B1 | 9/2003 | Makikawa et al. |
| 6,616,035 B2 | 9/2003 | Ehrensvard et al. |
| 6,618,829 B2 | 9/2003 | Pax et al. |
| 6,620,545 B2 | 9/2003 | Goenka et al. |
| 6,622,049 B2 | 9/2003 | Penner et al. |
| 6,632,563 B1 | 10/2003 | Krasnov et al. |
| 6,637,906 B2 | 10/2003 | Knoerzer et al. |
| 6,637,916 B2 | 10/2003 | Mullner |
| 6,639,578 B1 | 10/2003 | Comiskey et al. |
| 6,645,675 B1 | 11/2003 | Munshi |
| 6,650,000 B2 | 11/2003 | Ballantine et al. |
| 6,650,942 B2 | 11/2003 | Howard et al. |
| 6,662,430 B2 | 12/2003 | Brady et al. |
| 6,664,006 B1 | 12/2003 | Munshi |
| 6,673,484 B2 | 1/2004 | Matsuura |
| 6,673,716 B1 | 1/2004 | D'Couto et al. |
| 6,674,159 B1 | 1/2004 | Peterson et al. |
| 6,677,070 B2 | 1/2004 | Kearl |
| 6,683,244 B2 | 1/2004 | Fujimori et al. |
| 6,683,749 B2 | 1/2004 | Daby et al. |
| 6,686,096 B1 | 2/2004 | Chung |
| 6,693,840 B2 | 2/2004 | Shimada et al. |
| 6,700,491 B2 | 3/2004 | Shafer |
| 6,706,449 B2 | 3/2004 | Mikhaylik et al. |
| 6,709,778 B2 | 3/2004 | Johnson |
| 6,713,216 B2 | 3/2004 | Kugai et al. |
| 6,713,389 B2 | 3/2004 | Speakman |
| 6,713,987 B2 | 3/2004 | Krasnov et al. |
| 6,723,140 B2 | 4/2004 | Chu et al. |
| 6,730,423 B2 | 5/2004 | Einhart et al. |
| 6,733,924 B1 | 5/2004 | Skotheim et al. |
| 6,737,197 B2 | 5/2004 | Chu et al. |
| 6,737,789 B2 | 5/2004 | Radziemski et al. |
| 6,741,178 B1 | 5/2004 | Tuttle |
| 6,750,156 B2 | 6/2004 | Le et al. |
| 6,752,842 B2 | 6/2004 | Luski et al. |
| 6,753,108 B1 | 6/2004 | Hampden-Smith et al. |
| 6,753,114 B2 | 6/2004 | Jacobs et al. |
| 6,760,520 B1 | 7/2004 | Medin et al. |
| 6,764,525 B1 | 7/2004 | Whitacre et al. |
| 6,768,246 B2 | 7/2004 | Pelrine et al. |
| 6,768,855 B1 | 7/2004 | Bakke et al. |
| 6,770,176 B2 | 8/2004 | Benson et al. |
| 6,773,848 B1 | 8/2004 | Nortoft et al. |
| 6,780,208 B2 | 8/2004 | Hopkins et al. |
| 6,797,428 B1 | 9/2004 | Skotheim et al. |
| 6,797,429 B1 | 9/2004 | Komatsu |
| 6,805,998 B2 | 10/2004 | Jensen et al. |
| 6,805,999 B2 | 10/2004 | Lee et al. |
| 6,818,356 B1 | 11/2004 | Bates |
| 6,822,157 B2 | 11/2004 | Fujioka |
| 6,824,922 B2 | 11/2004 | Park et al. |
| 6,827,826 B2 | 12/2004 | Demaray et al. |
| 6,828,063 B2 | 12/2004 | Park et al. |
| 6,828,065 B2 | 12/2004 | Munshi |
| 6,830,846 B2 | 12/2004 | Kramlich et al. |
| 6,835,493 B2 | 12/2004 | Zhang et al. |
| 6,838,209 B2 | 1/2005 | Langan et al. |
| 6,846,765 B2 | 1/2005 | Imamura et al. |
| 6,852,139 B2 | 2/2005 | Zhang et al. |
| 6,855,441 B1 | 2/2005 | Levanon |
| 6,861,821 B2 | 3/2005 | Masumoto et al. |
| 6,863,699 B1 | 3/2005 | Krasnov et al. |
| 6,866,901 B2 | 3/2005 | Burrows et al. |
| 6,866,963 B2 | 3/2005 | Seung et al. |
| 6,869,722 B2 | 3/2005 | Kearl |
| 6,884,327 B2 | 4/2005 | Pan et al. |
| 6,886,240 B2 | 5/2005 | Zhang et al. |
| 6,890,385 B2 | 5/2005 | Tsuchiya et al. |

| | | |
|---|---|---|
| 6,896,992 B2 | 5/2005 | Kearl |
| 6,899,975 B2 | 5/2005 | Watanabe et al. |
| 6,902,660 B2 | 6/2005 | Lee et al. |
| 6,905,578 B1 | 6/2005 | Moslehi et al. |
| 6,906,436 B2 | 6/2005 | Jenson et al. |
| 6,911,667 B2 | 6/2005 | Pichler et al. |
| 6,916,679 B2 | 7/2005 | Snyder et al. |
| 6,921,464 B2 | 7/2005 | Krasnov et al. |
| 6,923,702 B2 | 8/2005 | Graff et al. |
| 6,924,164 B2 | 8/2005 | Jensen |
| 6,929,879 B2 | 8/2005 | Yamazaki |
| 6,936,377 B2 | 8/2005 | Wensley et al. |
| 6,936,381 B2 | 8/2005 | Skotheim et al. |
| 6,936,407 B2 | 8/2005 | Pichler |
| 6,949,389 B2 | 9/2005 | Pichler et al. |
| 6,955,986 B2 | 10/2005 | Li |
| 6,962,613 B2 | 11/2005 | Jenson |
| 6,962,671 B2 | 11/2005 | Martin et al. |
| 6,964,829 B2 | 11/2005 | Utsugi et al. |
| 6,982,132 B1 | 1/2006 | Goldner et al. |
| 6,986,965 B2 | 1/2006 | Jenson et al. |
| 6,994,933 B1 | 2/2006 | Bates |
| 7,022,431 B2 | 4/2006 | Shchori et al. |
| 7,033,406 B2 | 4/2006 | Weir et al. |
| 7,045,246 B2 | 5/2006 | Simburger et al. |
| 7,045,372 B2 | 5/2006 | Ballantine et al. |
| 7,056,620 B2 | 6/2006 | Krasnov et al. |
| 7,073,723 B2 | 7/2006 | Fürst et al. |
| 7,095,372 B2 | 8/2006 | Soler Castany et al. |
| 7,129,166 B2 | 10/2006 | Speakman |
| 7,131,189 B2 | 11/2006 | Jenson |
| 7,144,654 B2 | 12/2006 | LaFollette et al. |
| 7,144,655 B2 | 12/2006 | Jenson et al. |
| 7,157,187 B2 | 1/2007 | Jenson |
| 7,158,031 B2 | 1/2007 | Tuttle |
| 7,162,392 B2 | 1/2007 | Vock et al. |
| 7,183,693 B2 | 2/2007 | Brantner et al. |
| 7,186,479 B2 | 3/2007 | Krasnov et al. |
| 7,194,801 B2 | 3/2007 | Jenson et al. |
| 7,198,832 B2 | 4/2007 | Burrows et al. |
| 7,202,825 B2 | 4/2007 | Leizerovich et al. |
| 7,220,517 B2 | 5/2007 | Park et al. |
| 7,230,321 B2 | 6/2007 | McCain |
| 7,247,408 B2 | 7/2007 | Skotheim et al. |
| 7,253,494 B2 | 8/2007 | Mino et al. |
| 7,265,674 B2 | 9/2007 | Tuttle |
| 7,267,904 B2 | 9/2007 | Komatsu et al. |
| 7,267,906 B2 | 9/2007 | Mizuta et al. |
| 7,273,682 B2 | 9/2007 | Park et al. |
| 7,274,118 B2 | 9/2007 | Jenson et al. |
| 7,288,340 B2 | 10/2007 | Iwamoto |
| 7,316,867 B2 | 1/2008 | Park et al. |
| 7,323,634 B2 | 1/2008 | Speakman |
| 7,332,363 B2 | 2/2008 | Edwards |
| 7,335,441 B2 | 2/2008 | Luski et al. |
| RE40,137 E | 3/2008 | Tuttle et al. |
| 7,345,647 B1 | 3/2008 | Rodenbeck |
| 7,348,099 B2 | 3/2008 | Mukai et al. |
| 7,389,580 B2 | 6/2008 | Jenson et al. |
| 7,400,253 B2 | 7/2008 | Cohen |
| 7,410,730 B2 | 8/2008 | Bates |
| RE40,531 E | 10/2008 | Graff et al. |
| 7,468,221 B2 | 12/2008 | LaFollette et al. |
| 7,494,742 B2 | 2/2009 | Tarnowski et al. |
| 7,670,724 B1 | 3/2010 | Chan et al. |
| 2001/0005561 A1 | 6/2001 | Yamada et al. |
| 2001/0027159 A1 | 10/2001 | Kaneyoshi |
| 2001/0031122 A1 | 10/2001 | Lackritz et al. |
| 2001/0032666 A1 | 10/2001 | Jenson et al. |
| 2001/0033952 A1 | 10/2001 | Jenson et al. |
| 2001/0034106 A1 | 10/2001 | Moise et al. |
| 2001/0041294 A1 | 11/2001 | Chu et al. |
| 2001/0041460 A1 | 11/2001 | Wiggins |
| 2001/0052752 A1 | 12/2001 | Ghosh et al. |
| 2001/0054437 A1 | 12/2001 | Komori et al. |
| 2001/0055719 A1 | 12/2001 | Akashi et al. |
| 2002/0000034 A1 | 1/2002 | Jenson |
| 2002/0001746 A1 | 1/2002 | Jenson |
| 2002/0001747 A1 | 1/2002 | Jenson |
| 2002/0004167 A1 | 1/2002 | Jenson et al. |
| 2002/0009630 A1 | 1/2002 | Gao et al. |
| 2002/0019296 A1 | 2/2002 | Freeman et al. |
| 2002/0028377 A1 | 3/2002 | Gross |
| 2002/0033330 A1 | 3/2002 | Demaray et al. |
| 2002/0037756 A1 | 3/2002 | Jacobs et al. |
| 2002/0066539 A1 | 6/2002 | Muller |
| 2002/0067615 A1 | 6/2002 | Muller |
| 2002/0071989 A1 | 6/2002 | Verma et al. |
| 2002/0076133 A1 | 6/2002 | Li et al. |
| 2002/0091929 A1 | 7/2002 | Ehrensvard |
| 2002/0093029 A1 | 7/2002 | Ballantine et al. |
| 2002/0106297 A1 | 8/2002 | Ueno et al. |
| 2002/0115252 A1 | 8/2002 | Haukka et al. |
| 2002/0134671 A1 | 9/2002 | Demaray et al. |
| 2002/0139662 A1 | 10/2002 | Lee |
| 2002/0140103 A1 | 10/2002 | Kloster et al. |
| 2002/0159245 A1 | 10/2002 | Murasko et al. |
| 2002/0161404 A1 | 10/2002 | Schmidt |
| 2002/0164441 A1 | 11/2002 | Amine et al. |
| 2002/0170821 A1 | 11/2002 | Sandlin et al. |
| 2002/0170960 A1 | 11/2002 | Ehrensvard et al. |
| 2003/0019326 A1 | 1/2003 | Han et al. |
| 2003/0022487 A1 | 1/2003 | Yoon et al. |
| 2003/0024994 A1 | 2/2003 | Ladyansky |
| 2003/0029493 A1 | 2/2003 | Plessing |
| 2003/0035906 A1 | 2/2003 | Memarian et al. |
| 2003/0036003 A1 | 2/2003 | Shchori et al. |
| 2003/0042131 A1 | 3/2003 | Johnson |
| 2003/0044665 A1 | 3/2003 | Rastegar et al. |
| 2003/0048635 A1 | 3/2003 | Knoerzer et al. |
| 2003/0063883 A1 | 4/2003 | Demaray et al. |
| 2003/0064292 A1 | 4/2003 | Neudecker et al. |
| 2003/0068559 A1 | 4/2003 | Armstrong et al. |
| 2003/0076642 A1 | 4/2003 | Shiner et al. |
| 2003/0077914 A1 | 4/2003 | Le et al. |
| 2003/0079838 A1 | 5/2003 | Brcka |
| 2003/0091904 A1 | 5/2003 | Munshi |
| 2003/0095463 A1 | 5/2003 | Shimada et al. |
| 2003/0097858 A1 | 5/2003 | Strohhofer et al. |
| 2003/0109903 A1 | 6/2003 | Berrang et al. |
| 2003/0127319 A1 | 7/2003 | Demaray et al. |
| 2003/0134054 A1 | 7/2003 | Demaray et al. |
| 2003/0141186 A1 | 7/2003 | Wang et al. |
| 2003/0143853 A1 | 7/2003 | Celii et al. |
| 2003/0146877 A1 | 8/2003 | Mueller |
| 2003/0152829 A1 | 8/2003 | Zhang et al. |
| 2003/0162094 A1 | 8/2003 | Lee et al. |
| 2003/0173207 A1 | 9/2003 | Zhang et al. |
| 2003/0173208 A1 | 9/2003 | Pan et al. |
| 2003/0174391 A1 | 9/2003 | Pan et al. |
| 2003/0175142 A1 | 9/2003 | Milonopoulou et al. |
| 2003/0178623 A1 | 9/2003 | Nishiki et al. |
| 2003/0178637 A1 | 9/2003 | Chen et al. |
| 2003/0180610 A1 | 9/2003 | Felde et al. |
| 2003/0185266 A1 | 10/2003 | Henrichs |
| 2003/0231106 A1 | 12/2003 | Shafer |
| 2003/0232248 A1 | 12/2003 | Iwamoto et al. |
| 2004/0008587 A1 | 1/2004 | Siebott et al. |
| 2004/0015735 A1 | 1/2004 | Norman |
| 2004/0023106 A1 | 2/2004 | Benson et al. |
| 2004/0028875 A1 | 2/2004 | Van Rijn et al. |
| 2004/0029311 A1 | 2/2004 | Snyder et al. |
| 2004/0038050 A1 | 2/2004 | Saijo et al. |
| 2004/0043557 A1 | 3/2004 | Haukka et al. |
| 2004/0048157 A1 | 3/2004 | Neudecker et al. |
| 2004/0058237 A1 | 3/2004 | Higuchi et al. |
| 2004/0072067 A1 | 4/2004 | Minami et al. |
| 2004/0077161 A1 | 4/2004 | Chen et al. |
| 2004/0078662 A1 | 4/2004 | Hamel et al. |
| 2004/0081415 A1 | 4/2004 | Demaray et al. |
| 2004/0081860 A1 | 4/2004 | Hundt et al. |
| 2004/0085002 A1 | 5/2004 | Pearce |
| 2004/0101761 A1 | 5/2004 | Park et al. |
| 2004/0105644 A1 | 6/2004 | Dawes |
| 2004/0106038 A1 | 6/2004 | Shimamura et al. |
| 2004/0106046 A1 | 6/2004 | Inda |
| 2004/0118700 A1 | 6/2004 | Schierle-Arndt et al. |
| 2004/0126305 A1 | 7/2004 | Chen et al. |

| | | |
|---|---|---|
| 2004/0151986 A1 | 8/2004 | Park et al. |
| 2004/0161640 A1 | 8/2004 | Salot |
| 2004/0175624 A1 | 9/2004 | Luski et al. |
| 2004/0188239 A1 | 9/2004 | Robison et al. |
| 2004/0209159 A1 | 10/2004 | Lee et al. |
| 2004/0212276 A1 | 10/2004 | Brantner et al. |
| 2004/0214079 A1 | 10/2004 | Simburger et al. |
| 2004/0219434 A1 | 11/2004 | Benson et al. |
| 2004/0245561 A1 | 12/2004 | Sakashita et al. |
| 2004/0258984 A1 | 12/2004 | Ariel et al. |
| 2004/0259305 A1 | 12/2004 | Demaray et al. |
| 2005/0000794 A1 | 1/2005 | Demaray et al. |
| 2005/0006768 A1 | 1/2005 | Narasimhan et al. |
| 2005/0048802 A1 | 3/2005 | Zhang et al. |
| 2005/0070097 A1 | 3/2005 | Barmak et al. |
| 2005/0072458 A1 | 4/2005 | Goldstein |
| 2005/0079418 A1 | 4/2005 | Kelley et al. |
| 2005/0095506 A1 | 5/2005 | Klaassen |
| 2005/0105231 A1 | 5/2005 | Hamel et al. |
| 2005/0110457 A1 | 5/2005 | LaFollette et al. |
| 2005/0112461 A1 | 5/2005 | Amine et al. |
| 2005/0118464 A1 | 6/2005 | Levanon |
| 2005/0130032 A1 | 6/2005 | Krasnov et al. |
| 2005/0133361 A1 | 6/2005 | Ding et al. |
| 2005/0141170 A1 | 6/2005 | Honda et al. |
| 2005/0142447 A1 | 6/2005 | Nakai et al. |
| 2005/0147877 A1 | 7/2005 | Tarnowski et al. |
| 2005/0158622 A1 | 7/2005 | Mizuta et al. |
| 2005/0170736 A1 | 8/2005 | Cok |
| 2005/0175891 A1 | 8/2005 | Kameyama et al. |
| 2005/0176181 A1 | 8/2005 | Burrows et al. |
| 2005/0181280 A1 | 8/2005 | Ceder et al. |
| 2005/0183946 A1 | 8/2005 | Pan et al. |
| 2005/0189139 A1 | 9/2005 | Stole |
| 2005/0208371 A1 | 9/2005 | Kim et al. |
| 2005/0239917 A1 | 10/2005 | Nelson et al. |
| 2005/0255828 A1 | 11/2005 | Fisher |
| 2005/0266161 A1 | 12/2005 | Medeiros et al. |
| 2006/0019504 A1 | 1/2006 | Taussig |
| 2006/0021214 A1 | 2/2006 | Jenson et al. |
| 2006/0021261 A1 | 2/2006 | Face |
| 2006/0040177 A1 | 2/2006 | Onodera et al. |
| 2006/0046907 A1 | 3/2006 | Rastegar et al. |
| 2006/0054496 A1 | 3/2006 | Zhang et al. |
| 2006/0057283 A1 | 3/2006 | Zhang et al. |
| 2006/0057304 A1 | 3/2006 | Zhang et al. |
| 2006/0063074 A1* | 3/2006 | Jenson et al. ............... 429/322 |
| 2006/0071592 A1 | 4/2006 | Narasimhan et al. |
| 2006/0155545 A1 | 7/2006 | Jayne |
| 2006/0201583 A1 | 9/2006 | Michaluk et al. |
| 2006/0210779 A1 | 9/2006 | Weir et al. |
| 2006/0222954 A1 | 10/2006 | Skotheim et al. |
| 2006/0234130 A1 | 10/2006 | Inda |
| 2006/0237543 A1 | 10/2006 | Goto et al. |
| 2006/0255435 A1 | 11/2006 | Fuergut et al. |
| 2006/0286448 A1 | 12/2006 | Snyder et al. |
| 2007/0009802 A1 | 1/2007 | Lee et al. |
| 2007/0021156 A1 | 1/2007 | Hoong et al. |
| 2007/0023275 A1 | 2/2007 | Tanase et al. |
| 2007/0037058 A1 | 2/2007 | Visco et al. |
| 2007/0053139 A1 | 3/2007 | Zhang et al. |
| 2007/0087230 A1 | 4/2007 | Jenson et al. |
| 2007/0091543 A1 | 4/2007 | Gasse et al. |
| 2007/0125638 A1 | 6/2007 | Zhang et al. |
| 2007/0141468 A1* | 6/2007 | Barker ....................... 429/231.1 |
| 2007/0148065 A1 | 6/2007 | Weir et al. |
| 2007/0148553 A1* | 6/2007 | Weppner ..................... 429/322 |
| 2007/0151661 A1 | 7/2007 | Mao et al. |
| 2007/0164376 A1 | 7/2007 | Burrows et al. |
| 2007/0166612 A1 | 7/2007 | Krasnov et al. |
| 2007/0184345 A1 | 8/2007 | Neudecker et al. |
| 2007/0196682 A1 | 8/2007 | Visser et al. |
| 2007/0202395 A1 | 8/2007 | Snyder et al. |
| 2007/0205513 A1 | 9/2007 | Brunnbauer et al. |
| 2007/0210459 A1 | 9/2007 | Burrows et al. |
| 2007/0222681 A1 | 9/2007 | Greene et al. |
| 2007/0224951 A1 | 9/2007 | Gilb et al. |
| 2007/0235320 A1 | 10/2007 | White et al. |
| 2007/0264564 A1 | 11/2007 | Johnson et al. |
| 2007/0278653 A1 | 12/2007 | Brunnbauer et al. |
| 2007/0298326 A1 | 12/2007 | Angell et al. |
| 2008/0003496 A1 | 1/2008 | Neudecker et al. |
| 2008/0008936 A1 | 1/2008 | Mizuta et al. |
| 2008/0014501 A1 | 1/2008 | Skotheim et al. |
| 2008/0057397 A1 | 3/2008 | Skotheim et al. |
| 2008/0213672 A1 | 9/2008 | Skotheim et al. |
| 2008/0233708 A1 | 9/2008 | Hisamatsu |
| 2008/0254575 A1 | 10/2008 | Fuergut et al. |
| 2008/0261107 A1 | 10/2008 | Snyder et al. |
| 2008/0263855 A1 | 10/2008 | Li et al. |
| 2008/0286651 A1 | 11/2008 | Neudecker et al. |
| 2009/0181303 A1 | 7/2009 | Neudecker et al. |
| 2009/0302226 A1 | 12/2009 | Schieber et al. |
| 2010/0032001 A1 | 2/2010 | Brantner |
| 2010/0086853 A1 | 4/2010 | Venkatachalam et al. |

FOREIGN PATENT DOCUMENTS

| | | |
|---|---|---|
| CN | 1532984 | 9/2004 |
| DE | 19824145 | 12/1999 |
| DE | 10 2005 014 427 | 9/2006 |
| DE | 10 2006 054 309 | 11/2006 |
| DE | 10 2008 016 665 | 10/2008 |
| DE | 102007030604 | 1/2009 |
| EP | 0 510 883 | 10/1992 |
| EP | 0 639 655 | 2/1995 |
| EP | 0 652 308 | 5/1995 |
| EP | 0 820 088 | 1/1998 |
| EP | 1 068 899 | 1/2001 |
| EP | 0 867 985 | 2/2001 |
| EP | 1 092 689 | 4/2001 |
| EP | 1 189 080 | 3/2002 |
| EP | 1 713 024 | 10/2006 |
| FR | 2806198 | 9/2001 |
| FR | 2 861 218 | 4/2005 |
| JP | 55-009305 | 1/1980 |
| JP | 56-076060 | 6/1981 |
| JP | 56-156675 | 12/1981 |
| JP | 60-068558 | 4/1985 |
| JP | 61-269072 | 11/1986 |
| JP | 62-267944 | 11/1987 |
| JP | 63-290922 | 11/1988 |
| JP | 2000-162234 | 11/1988 |
| JP | 2-054764 | 2/1990 |
| JP | 2-230662 | 9/1990 |
| JP | 03-036962 | 2/1991 |
| JP | 4-058456 | 2/1992 |
| JP | 4-072049 | 3/1992 |
| JP | 6-010127 | 1/1994 |
| JP | 6-100333 | 4/1994 |
| JP | 7-233469 | 5/1995 |
| JP | 7-224379 | 8/1995 |
| JP | 08-114408 | 5/1996 |
| JP | 10-026571 | 1/1998 |
| JP | 10-239187 | 9/1998 |
| JP | 11-204088 | 7/1999 |
| JP | 2000-144435 | 5/2000 |
| JP | 2000-188099 | 7/2000 |
| JP | 2000-268867 | 9/2000 |
| JP | 2001-171812 | 6/2001 |
| JP | 2001-259494 | 9/2001 |
| JP | 2001-297764 | 10/2001 |
| JP | 2001-328198 | 11/2001 |
| JP | 2002-140776 | 5/2002 |
| JP | 2002-344115 | 11/2002 |
| JP | 2003-17040 | 1/2003 |
| JP | 2003-347045 | 12/2003 |
| JP | 2004-071305 | 3/2004 |
| JP | 2004-149849 | 5/2004 |
| JP | 2004-158268 | 6/2004 |
| JP | 2004-273436 | 9/2004 |
| JP | 2005-256101 | 9/2005 |
| JP | 2002-026412 | 2/2007 |
| JP | 7-107752 | 4/2007 |
| KR | 20020007881 | 1/2002 |
| KR | 20020017790 | 3/2002 |
| KR | 20020029813 | 4/2002 |
| KR | 20020038917 | 5/2002 |
| KR | 20030033913 | 5/2003 |

| | | |
|---|---|---|
| KR | 20030042288 | 5/2003 |
| KR | 20030085252 | 11/2003 |
| RU | 2241281 | 11/2004 |
| WO | WO 9513629 | 5/1995 |
| WO | WO 9623085 | 8/1996 |
| WO | WO 9623217 | 8/1996 |
| WO | WO 9727344 | 7/1997 |
| WO | WO 9735044 | 9/1997 |
| WO | WO 9847196 | 10/1998 |
| WO | WO 9943034 | 8/1999 |
| WO | WO 9957770 | 11/1999 |
| WO | WO 0021898 | 4/2000 |
| WO | WO 0022742 | 4/2000 |
| WO | WO 0028607 | 5/2000 |
| WO | WO 0036665 | 6/2000 |
| WO | WO 0060682 | 10/2000 |
| WO | WO 0060689 | 10/2000 |
| WO | WO 0062365 | 10/2000 |
| WO | WO 0101507 | 1/2001 |
| WO | WO 0117052 | 3/2001 |
| WO | WO 0124303 | 4/2001 |
| WO | WO 0133651 | 5/2001 |
| WO | WO 0139305 | 5/2001 |
| WO | WO 0173864 | 10/2001 |
| WO | WO 0173865 | 10/2001 |
| WO | WO 0173866 | 10/2001 |
| WO | WO 0173868 | 10/2001 |
| WO | WO 0173870 | 10/2001 |
| WO | WO 0173883 | 10/2001 |
| WO | WO 0173957 | 10/2001 |
| WO | WO 0182390 | 11/2001 |
| WO | WO 0212932 | 2/2002 |
| WO | WO 0242516 | 5/2002 |
| WO | WO 0247187 | 6/2002 |
| WO | WO 02071506 | 9/2002 |
| WO | WO 02101857 | 12/2002 |
| WO | WO 03003485 | 1/2003 |
| WO | WO 03005477 | 1/2003 |
| WO | WO 03026039 | 3/2003 |
| WO | WO 03036670 | 5/2003 |
| WO | WO 03069714 | 8/2003 |
| WO | WO 03080325 | 10/2003 |
| WO | WO 03083166 | 10/2003 |
| WO | WO 2004012283 | 2/2004 |
| WO | WO 2004021532 | 3/2004 |
| WO | WO 2004061887 | 7/2004 |
| WO | WO 2004077519 | 9/2004 |
| WO | WO 2004086550 | 10/2004 |
| WO | WO 2004093223 | 10/2004 |
| WO | WO 2004106581 | 12/2004 |
| WO | WO 2004106582 | 12/2004 |
| WO | WO 2005008828 | 1/2005 |
| WO | WO 2005013394 | 2/2005 |
| WO | WO 2005038957 | 4/2005 |
| WO | WO 2005067645 | 7/2005 |
| WO | WO 2005085138 | 9/2005 |
| WO | WO 2005091405 | 9/2005 |
| WO | WO 2006063308 | 6/2006 |
| WO | WO 2006085307 | 8/2006 |
| WO | WO 2007016781 | 2/2007 |
| WO | WO 2007019855 | 2/2007 |
| WO | WO 2007027535 | 3/2007 |
| WO | WO 2007095604 | 8/2007 |
| WO | WO 2008036731 | 3/2008 |

OTHER PUBLICATIONS

Barbier, D. et al., "Amplifying four-wavelength combiner, based on erbium/ytterbium-doped waveguide amplifiers and integrated splitters," IEEE Photonics Tech. Lett. 9:315-317 (1997).
Barbier, D., "Performances and potential applications of erbium doped planar waveguide amplifiers and lasers," Proc. OAA, Victoria, BC, Canada, pp. 58-63 (Jul. 21-23, 1997).
Bates et al., "Thin-Film Lithium Batteries" in New Trends in Electrochemical Technology: Energy Storage Systems for Electronics (T. Osaka & M. Datta eds. Gordon and Breach 2000).
Beach R.J., "Theory and optimization of lens ducts," Applied Optics 35(12): 2005-2015 (1996).
Sarro, P., "Silicon Carbide as a New MEMS Technology," Sensors and Actuators 82, 210-218 (2000).
Belkind, A. et al., "Pulsed-DC Reactive Sputtering of Dielectrics: Pulsing Parameter Effects," 43rd Annual Technical Conference Proceedings (2000).
Belkind, A. et al., "Using pulsed direct current power for reactive sputtering of $Al_2O_3$," J. Vac. Sci. Technol. A 17(4): 1934-1940 (1999).
Bestwick, T., "ASOC™ silicon integrated optics technology," SPIE 3631: 182-190 (1999).
Borsella, E. et al., "Structural incorporation of silver in soda-lime glass by the ion-exchange process: a photoluminescence spectroscopy study," Applied Physics A 71: 125-132 (2000).
Byer, R.L., "Nonlinear optics and solid-state lasers: 2000," IEEE J. Selected Topics in Quantum Electronics 6(6): 911-930 (2000).
Campbell, S.A. et al., "Titanium dioxide (TiO2)-based gate insulators," IBM J. Res. Develop. 43(3): 383-392 (1999).
Chang, C.Y. and Sze, S.M. (eds.), in ULSI Technology, The McGraw-Hill Companies, Inc., Nyew York, Chapter 4, pp. 169-170 and 226-231 (1996).
Chen, G. et al., "Development of supported bifunctional electrocatalysts for unitized regenerative fuel cells," J. Electrochemical Society 149(8): A1092-A1099 (2002).
Choi, Y.B. et al., "Er-Al-codoped silicate planar light waveguide-type amplifier fabricated by radio-frequency sputtering," Optics Letters 25(4): 263-265 (2000).
Choy et al., "Eu-Doped Y2O3 Phosphor Films Produced by Electrostatic-Assisted Chemical Vapor Deposition," J. Mater. Res. 14(7): 3111-3114 (Jul. 1999).
Cocorullo, G. et al., "Amorphous silicon waveguides and light modulators for integrated photonics realized by low-temperature plasma-enhanced chemical-vapor deposition," Optics Lett. 21(24): 2002-2004 (1996).
Cooksey, K. et al., "Predicting permeability & Transmission rate for multilayer materials," Food Technology 53(9): 60-63 (1999).
Crowder, M.A. et al., "Low-temperature single-crystal Si TFT's fabricated on Si films processed via sequential lateral solidification," IEEE Electron Device Lett. 19(8): 306-308 (1998).
Delavaux, J-M. et al., "Integrated optics erbium ytterbium amplifier system in 10Gb/s fiber transmission experiment," 22nd European Conference on Optical Communication, Osla, I.123-I.126 (1996).
Distributed Energy Resources: Fuel Cells, Projects, 4 pages http://www.eere.energy.gov/der/fuel_cells/projects.html (2003).
Dorey, R.A., "Low temperature micromoulding of functional ceramic devices," Grant summary for GR/S84156/01 for the UK Engineering and Physical Sciences Research Council, 2 pages (2004).
DuPont Teijin Films, Mylar 200 SBL 300, Product Information, 4 pages (2000).
Electrometals Technologies Limited, Financial Report for 2002, Corporate Directory, Chairman's review, Review of Operations, 10 pages (2002).
E-Tek website: FAQ, Inside E-Tek, E-TEk News, Products; http://www.etek-inc.com/, 10 pages (2003).
Flytzanis, C. et al., "Nonlinear optics in composite materials," in Progress in Optics XXIX, Elsevier Science Publishers B.V., pp. 323-425 (1991).
Frazao, O. et al., "EDFA gain flattening using long-period fibre gratings based on the electric arc technique," Proc. London Comm. Symp. 2001, London, England, 3 pages (2001).
Fujii, M. et al., "1.54 μm photoluminescence of $Er^{3+}$ doped into $SiO_2$ films containing Si nanocrystals: evidence for energy transfer from Si nanocrystals for $Er^{3+}$," Appl. Phys. Lett. 71(9): 1198-1200 (1997).
Garcia, C. et al., "Size dependence of lifetime and absorption cross section of Si nanocrystals embedded in $SiO_2$," Appl. Phys. Lett. 82(10): 1595-1597 (2003).
Goossens, A. et al., "Sensitization of $TiO_2$ with p-type semiconductor polymers," Chem. Phys. Lett. 287: 148 (1998).
Greene, J.E. et al., "Morphological and electrical properties of rf sputtered $Y_2O_3$-doped $ZrO_2$ thin films," J. Vac. Sci. Tech. 13(1): 72-75 (1976).
Han, H.-S. et al., "Optical gain at 1.54 μm in Erbium-doped Silicon nanocluster sensitized waveguide," Appl. Phys. Lett. 79(27): 4568-4570 (2001).

Hayakawa, T. et al., "Enhanced fluorescence from $Eu^{3+}$ owing to surface plasma oscillation of silver particles in glass," J. Non-Crystalline Solids 259: 16-22 (1999).

Hayakawa, T. et al., "Field enhancement effect of small Ag particles on the fluorescence from $Eu^{3+}$-doped $SiO_2$ glass," Appl. Phys. Lett. 74(11): 1513-1515 (1999).

Hayfield, P.C.S., I Development of a New Material-Monolithic $Ti_4O_7$ Ebonix® Ceramic, Royal Society of Chemistry, Cambridge, Table of Contents, 4 pages (2002).

Hehlen, M.P. et al., "Spectroscopic properties of $Er^{3+}$—and $Yb^{3+}$-doped soda-lime silicate and aluminosilicate glasses," Physical Review B 56(15): 9302-9318 (1997).

Hehlen, M.P. et al., "Uniform upconversion in high-concentration $Er^{3+}$-doped soda lime silicate and aluminosilicate glasses," Optics Letters 22(11); 772-774 (1997).

Horst, F. et al., "Compact, tunable optical devices in silicon-oxynitride waveguide technology," Top. Meeting Integrated Photonics Res. '00, Quebec, Canada, p. IThF1, 3 pages (2000).

Howson, R.P., "The reactive sputtering of oxides and nitrides," Pure & Appl. Chem. 66(6): 1311-1318 (1994).

Hubner, J. and Guldberg-Kjaer, S., "Planar Er- and Yb-doped amplifiers and lasers," COM Technical University of Denmark, $10^{th}$ European Conf. on Integrated Optics, Session WeB2, pp. 71-74 (2001).

Hwang et al., "Characterization of sputter-deposited LiMn2O4 thin films for rechargeable microbatteries," 141(12) J. Electrochem. Soc. 3296-99 (1994).

Hwang, M-S. et al., "The effect of pulsed magnetron sputtering on the properties of iridium tin oxide thin films," Surface and Coatings Tech. 171: 29-33 (2003).

Im, J.S. and Sposili, R.S., "Crystalline Si films for integrated active-matrix liquid crystal displays," MRS Bulletin, pp. 39-48 (1996).

Im, J.S. et al., "Controlled super-lateral growth of Si-films for microstructural manipulation and optimization," Physica Status Solidi (A) 166(2): 603-617 (1998).

Im, J.S. et al., "Single-crystal Si films for thin-film transistor devices," Appl. Physics Lett. 70(25): 3434-3436 (1997).

Itoh, M. et al., "Large reduction of singlemode-fibre coupling loss in 1.5% Δ planar lightwave circuits using spot-size converters," Electronics Letters 38(2): 72-74 (2002).

Jackson, M.K. and Movassaghi, M., "An accurate compact EFA model," Eur. Conf. Optical Comm., Munich, Germany, 2 pages (2000).

Janssen, R. et al., "Photoinduced electron transfer from conjugated polymers onto nanocrystalline $TiO_2$," Synthet. Metal., 1 page (1999).

Johnson, J.E. et al., "Monolithically integrated semiconductor optical amplifier and electroabsorption modulator with dual-waveguide spot-size converter input," IEEE J. Selected topics in Quantum Electronics 6(1): 19-25 (2000).

Jonsson, L.B. et al., "Frequency response in pulsed DC reactive sputtering processes," Thin Solid Films 365: 43-48 (2000).

Kato, K. and Inoue, Y., "Recent progress on PLC hybrid integration," SPIE 3631: 28-36 (1999).

Kato, K. and Tohmori, Y., "PLC hybrid integration technology and its application to photonic components," IEEE J. Selected Topics in Quantum Electronics 6(1): 4-13 (2000).

Kelly, P.J. and Arnell, R.D., "Control of the structure and properties of aluminum oxide coatings deposited by pulsed magnetron sputtering," J. Vac. Sci. Technol. A 17(3): 945-953 (1999).

Kelly, P.J. et al., "A novel technique for the deposition of aluminum-doped zinc oxide films," Thin Solid Films 426(1-2): 111-116 (2003).

Kelly, P.J. et al., "Reactive pulsed magnetron sputtering process for alumina films," J. Vac. Sci. Technol. A 18(6): 2890-2896 (2000).

Kik, P.G. and Polman, A., "Gain limiting processes in Er-doped Si nanocrystal waveguides in $SiO_2$," J. Appl. Phys. 91(1): 536-536 (2002).

Kim et al., "Correlation Between the Microstructures and the Cycling Performance of $RuO_2$ Electrodes for Thin-Film Microsupercapacitros," J. Vac. Sci. Technol. B20(5): 1827-1832 (Sep. 2002).

Kim, D-W. et al. "Mixture Behavior and Microwave Dielectric Properties in the Low-fired $TiO_2$-CuO System," Jpn. J. Appl. Phys. 39:2696-2700 (2000).

Kim, H-K. et al., "Characteristics of rapid-thermal-annealed LiCoO2 cathode film for an all-solid-state thin film microbattery," J. Vac. Sci. Technol. A 22(4): 1182-1187 (2004).

Kim, J-Y. et al. "Frequency-dependent pulsed direct current magnetron sputtering of titanium oxide films," J. Vac. Sci. Technol. A 19(2):429-434 (2001).

Ladouceur, F. and Love, J.D., in: Silica-based Buried Channel Waveguides and Devices, Chapman & Hall, London, Table of Contents, 6 pages (1996).

Ladouceur, F. et al., "Effect of side wall roughness in buried channel waveguides," IEEE Proc. Optoelectron. 141(4):242-248 (1994).

Lamb, W. and Zeiler, R., Designing Non-Foil Containing Skins for Vacuum Insulation Panel (VIP) Application, Vuoto XXVIII(1-2):55-58 (1999).

Hwang et al., "Characterization of Sputter-Deposited $LiMn_2O_4$ Thin Films for Rechargeable Microbatteries," 141(12) J. Electrochem. Soc. 3296-99 (1994).

Jones et al., 53-56 Solid State Ionics 628 (1992).

Mattox "Handbook of Physical Vapor Deposition (PVD) Processing, Society of Vacuum Coaters," Albuquerque, New Mexico 660f and 692ff, Noyes Publications (1998).

Lamb, W.B., "Designing Nonfoil Containing Skins for VIP Applications," DuPont VIA Symposium Presentation, 35 Pages (1999).

Lange, M.R. et al, "High Gain Ultra-Short Length Phosphate glass Erbium-Doped Fiber Amplifier Material," OSA Optical Fiber Communications (OFC), 3 Pages (2002).

Laporta, P. et al, "Diode-pumped cw bulk Er: Yb: glass laser," Optics Letters 16(24):1952-1954 (1991).

Laurent-Lund, C. et al., "PECVD Grown Mulitple Core Planar Wageguides with Extremely Low Interface Reflections and Losses," IEEE Photonics Tech. Lett. 10(10):1431-1433 (1998).

Lee, B.H. et al., "Effects of interfacial layer growth on the electrical characteristics of thin titanium oxide films on silion," Appl. Phys. Lett. 74(21):3143-3145 (1999).

Lee, K.K. et al., "Effect of size and roughness on light transmission in a $Si/SiO_2$ waveguide: Experiments and model," Appl. Phys. Lett. 77(11):1617-1619 (2000).

Love, J.D. et al., "Quantifying Loss Minimisation in Single-Mode Fibre Tapers," Electronics Letters 22(17):912-914 (1986).

Mardare, D. and Rusu, G.I., "On the structure of Titanium Oxide Thin Films," Andalele Stiintifice Ale Universitatii IASI, Romania, pp. 201-208 (1999).

Marques, P.V.S. et al., "Planar Silica-on-Silicon Waveguide Lasers Based in Two Layers Core Devices," $10^{th}$ European Conference on Integrated Optics, Session WeB2, pp. 79-82 (2001).

Meijerink, A. et al., "Luminescence of $Ag^+$ in Crystalline and Glassy $Srb_4O_7$," J. Physics Chem. Solids 54(8):901-906 (1993).

Mesnaoui, M. et al, "Spectroscopic properties of $Ag^+$ ions in phosphate glasses of $NaPO_3$- $AgPO_3$ system," Eur. J. Solid State Inorg. Chem. 29:1001-1013 (1992).

Mitomi, O. et al., "Design of a Single-Mode Tapered Waveguide for Low-Loss Chip-to-Fiber Coupling," IEEE J. Quantum Electronics 30(8): 1787-1793 (1994).

Mizuno, Y. et al "Temperature dependence of oxide decomposition on titanium surfaces in UHV," J. Vac. Sci & Tech. A. 20(5): 1716-1721 (2002).

Ohkubo, H. et al., Polarization-Insensitive Arrayed-Waveguide Grating Using Pure $SiO_2$ Cladding, Fifth Optoelectronics and Communication Conference (OECC 2000) Technical Digest, pp. 366-367 (2000).

Ohmi, S. et al., "Rare earth mental oxides for high-K fate insulator," VLSI Design 2004, 1 Page (2004).

Ohtsuki, T., et al., "Gain Characteristics of high concentration $Er^{3+}$-doped phosphate glass waveguide," J. Appl. Phys. 78(6):3617-3621 (1995).

Ono, H. et al., "Design of a Low-loss Y-branch Optical Waveguide," Fifth Optoelectronic and Communications Conference (OECC 2000) Technical Digest, pp. 502-503 (2000).

Padmini, P. et al. "Realization of High Tunability Barium Strontium Titanate Thin Films by rf Megnetron Sputtering," Appl. Phys. Lett. 75(20):3186-3188 (1999).

Pan, T. et al., "Planar Er³⁺-doped aluminosilicate waveguide amplifier with more than 10 dB gain across C-band," Optical Society of America, 3 pages (2000).
Park et al., "Characteristics of Pt Thin Film on the Conducting Ceramics TiO and Ebonex ($Ti_4O_7$) as Electrode Materials," Thin Solid Films 258: 5-9 (1995).
Peters, D.P. et al., "Formation mechanism of silver nanocrystals made by ion irradiation of Na⁺—Ag⁺ ion-exchanged sodalime silicate glass," Nuclear Instruments and Methods in Physics Research B 168:237-244 (2000).
Rajarajan, M. et al., "Numerical Study of Spot-Size Expanders fro an Efficient OEIC to SMF Coupling," IEEE Photonics Technology Letters 10(8): 1082-1084 (1998).
Ramaswamy, R.V. et al., "Ion-Exchange Glass Waveguides: A Review," J. Lightwave Technology 6(6): 984-1002 (1988).
Roberts, S.W. et al., "The Photoluminescence of Erbium-doped Silicon Monoxide," University of Southampton, Department of Electronics and Computer Science Research Journal, 7 pages (1996).
Saha et al., "Large Reduction of Leakage Current by Graded-Layer La Doping in (Ba0.5,Sr0.5)TiO3 Thin Films," Appl. Phys. Lett. 79(1): 111-113 (Jul. 2001).
Sanyo Vacuum Industries Co., Ltd. Products Infor, $TiO_2$, (2003), 1 page, http://www.sanyovac.co.jp/Englishweb/products?ETiO2.htm.
Schermer, R. et al., "Investigation of Mesa Dielectric Waveguides," Proceedings of the OSA Integrated Photonics Research Topical Meeting and Exhibit, Paper No. IWB3, 3 pages (2001).
Schiller, S. et al., "PVD Coating of Plastic Webs and Sheets with High Rates on Large Areas," European Materials Research Society 1999 Spring Meeting, Jun. 1-4, 1999, Strasbourg, France, 13 pages (1999).
Scholl, R., "Power Supplies for Pulsed Plasma Technologies: State-of-the-Art and Outlook," Advances Energy Industries, Inc. 1-8 (1999).
Scholl, R., "Power Systems for Reactive Sputtering of Insulating Films," Advances Energy Industries, Inc., (Aug. 1-8, 2001).
Second International Symposium of Polymer Surface Modification: Relevance to Adhesion, Preliminary Program, 13 pages (1999).
Seventh International Conference on $TiO_2$ Photocatalysis: Fundamentals & Applications, Toronto, Ontario, Canada, Final Program, 7 pages (Nov. 17-21, 2002).
Sewell, P. et al., "Rib Waveguide Spot-Size Transformers: Modal Properties," J Lightwave Technology 17(5):848-856 (1999).
Shaw, D.G. et al., "Use of Vapor Deposited Acrylate Coatings to Improve the Barrier Properties of Metallized Film," Society of Vacuum Coaters, 37th Annual Technical Conference Proceedings, pp. 240-244 (1994).
Shin, J.C. et al. "Dielectric and Electrical Properties of Sputter Grown $(Ba,Se)TiO_3$ Thin Films," J. Appl. Phys. 86(1):506-513 (1999).
Shmulovich, J. et al., "Recent progress in Erbium-doped waveguide amplifiers," Bell Laboratories, pp. 35-37 (1999).
Slooff, L.H. et al., "Optical properties of Erbium-doped organic polydentate cage complexes," J. Appl. Phys. 83(1):497-503 (1998).
Smith, R.E. et al., "Reduced Coupling Loss Using a Tapered-Rib Adiabatic-Following Fiber Coupler," IEEE Photonics Technology Lett. 8(8):1052-1054 (1996).
Snoeks, E. et al., "Cooperative upconversion in erbium-implanted soda-lime silicate glass optical waveguides," J. Opt. Soc. Am. B 12(8): 1468-1474 (1995).
Strohhofer, C. and Polman, A. "Energy transfer to Er³⁺ in Ag ion-exchanged glass," FOM Institute for Atomic and Molecular Physics, 10 pages (2001).
Sugiyama, A. et al., "Gas Permeation Through the Pinholes of Plastic Film Laminated with Aluminum Foil," Vuoto XXVIII(1-2):51-54 (1999).
Tervonen, A. "Challenges and opportunities for integrated optics in optical networks," SPIE 3620:2-11 (1999).
Ting, C.Y. et al., "Study of planarized sputter-deposited $SiO_2$," J. Vac. Sci Technol, 15(3):1105-1112 (1978).
Tomaszewski, H. et al., "Yttria-stabilized zirconia thin films grown by reactive r.f. magnetron sputtering," Thin Solid Films 287: 104-109 (1996).

Triechel, O. and Kirchhoff, V., "The influences of pulsed magnetron sputtering on topography and crystallinity of $TiO_2$ films on glass," Surface and Coating Technology 123:268-272 (2000).
Tukamoto, H. and West, A.R., "Electronic Conductivity of $LiCoO_s$ and Its Enhancement by Magnesium Doping," J. Electrochem. Soc 144(9):3164-3168 (1997).
Van Dover, R.B., "Amorphous Lanthanide-Doped $TiO_x$ Dielectric Films," Appl. Phys. Lett. 74(20):3041-3043 (1999).
Viljanen, J. and Leppihalme, M., "Planner Optical Coupling Elements for Multimode Fibers with Two-Step Ion Migration Process," Applied Physics 24(1):61-63 (1981).
Villegas, M.A. et al., "Optical spectroscopy of a soda lime glass exchanged with silver," Phys. Chem. Glasses 37(6):248-253 (1996).
Von Rottkay, K. et al., "Influences of stoichiometry on electrochromic cerium-titanium oxide compounds," Presented at the 11th Int'l Conference of Solid State Ionics, Honolulu, Hawaii, Nov. 19, 1997, Published in Solid State Ionics 113-115:425-430. (1998).
Wang, B. et al., "Characterization of Thin-Film Rechargeable Lithium Batteries with Lithium Cobalt Oxide Cathodes," J. Electrochem. Soc. 143:3203-13 (1996).
Westlinder, J. et al., "Simulations and Dielectric Characterization of Reactive dc Magnetron Cosputtered $(Ta_2O_5)_{1-x}(TiO_2)_x$ Thin Films," J Vac. Sci. Technol. B 20(3):855-861 (May/Jun. 2002).
Wilkes, K.E., "Gas Permeation Through Vacuum Barrier Films and its Effect on VIP Thermal Performance," presented at the Vacuum Insulation Panel Symp., Baltimore, Maryland, 21 pages (May 3, 1999).
Yanagawa, H. et al., "Index-and-Dimensional Taper and Its Application to Photonic Devices," J. Lightwave Technology 10(5):587-591 (1992).
Yoshikawa, K. et al., "Spray formed aluminum alloys for sputtering targets," Powder Metallurgy 43(3): 198-199 (2000).
Zhang, H. et al., "High Dielectric Strength, High k $TiO_2$ Films by Pulsed DC, Reactive Sputter Deposition," 5 pages (2001).
Dobkin, D.M., "Silicon Dioxide: Properties and Applications".
Abraham, K.M. et al., "Inorganic-organic composite solid polymer electrolytes," 147(4) J. Electrochem. Soc. 1251-56 (2000).
Abrahams, I., "$Li_6Zr_2O_7$, a new anion vacancy ccp based structure, determined by ab initio powder diffraction methods," 104 J. Solid State Chem. 397-403 (1993).
Amatucci, G. et al., "Lithium scandium phosphate-based electrolytes for solid state lithium rechargeable microbatteries," 60 Solid State Ionics 357-65 (1993).
Appetecchi, G.B. et al., "Composite polymer electrolytes with improved lithium metal electrode interfacial properties," 145(12) J. Electrochem. Soc. 4126-32 (1998).
Bates, J.B. et al., "Electrical properties of amorphous lithium electrolyte thin films," 53-56 Solid State Ionics 647-54 (1992).
Delmas, C. et al., "Des conducteurs ioniques pseudo-bidimensionnels $Li_8MO_6$ (M=Zr, Sn), $Li_7LO_6$ (L=Nb, Ta) et $Li_6In_2O_6$," 14 Mat. Res. Bull. 619-25 (1979).
Hu, Y-W. et al., "Ionic conductivity of lithium phosphate-doped lithium orthosilicate," 11 Mat. Res. Bull. 1227-30 (1976).
Neudecker, B. et al., "$Li_9SiAlO_8$: a lithium ion electrolyte for voltages above 5.4 V," 143(7) J. Electrochem. Soc. 2198-203 (1996).
Ohno, H. et al., "Electrical conductivity of a sintered pellet of octalithium zirconate," 132 J. Nucl. Mat. 222-30 (1985).
Scholder, V. et al., "Über Zirkonate, Hafnate und Thorate von Barium, Strontium, Lithium und Natrium," Zeitschrift für Anorganische und Allgemeine Chemie, Band 362, pp. 149-168 (1968).
Yu, X. et al., "A stable thin-film lithium electrolyte: lithium phosphorus oxynitride," 144(2) J. Electrochem. Soc. 524-532 (1997).
Hill, R. et al., "Large Area Deposition by Mid-Frequency AC Sputtering," Society of Vacuum Coaters, 41st Annual Tech, Conference Proceedings, 197-202 (1998).
Macák, Karol et al, "Ionized Sputter Deposition Using an Extremely High Plasma Density Pulsed Magnetron Discharge," J. Vac. Sci. Technol. A 18(4):1533-37 (2000).
Balanis, Constantine A., "Antenna Theory: Analysis and Design," 3rd Ed., pp. 817-820 (John Wiley & Sons, Inc. Publication, 2005).

* cited by examiner

US 8,268,488 B2

THIN FILM ELECTROLYTE FOR THIN FILM BATTERIES

RELATED APPLICATIONS

The present application is related to and claims the benefit under 35 U.S.C. §119 of U.S. provisional patent application Ser. No. 61/022,904, entitled "Thin Film Electrolyte for Thin Film Batteries," filed Jan. 23, 2008, and is a continuation-in-part, and claims the benefit under 35 U.S.C. §120, of U.S. patent application Ser. No. 12/339,361, entitled "Method for Sputter Targets for Electrolyte Films," filed Dec. 19, 2008, which claims the benefit under 35 U.S.C. §119 of U.S. provisional patent application Ser. No. 61/016,038, entitled "Method for Sputter Targets for Electrolyte Films," filed Dec. 21, 2007, all of which are incorporated herein in their entirety by reference.

FIELD OF THE INVENTION

The present invention relates to a solid-state lithium-ion thin-film electrolyte with, for example, increased lithium ion conductivity that lends itself preferably to higher power performance and extended shelf life in thin-film batteries and a method of fabricating the electrolyte.

BACKGROUND OF THE INVENTION

Solid-state lithium-ion thin-film batteries (TFBs) that are configured with a Lipon (Lithium phosphorus oxynitride—a potent lithium-ion thin-film electrolyte having the formula of ~$Li_{3.1}PO_{3.3}N_{0.5}$) electrolyte exhibit acceptable internal cell resistances over a wide temperature range while showing electrochemical stability in contact with very reducing electrodes, such as the metallic lithium anode, and very oxidizing electrodes, such as a charged $Li_{0.5}CoO_2$ cathode at 4.2V versus $Li/Li^+$. In addition, Lipon has one of the lowest electronic conductivities of all known room-temperature lithium-ion electrolytes, thereby providing Lipon TFBs with a 10+ year shelf-life and an extremely low capacity loss per year (<1%) under ambient conditions.

Currently known lithium compounds, however, have internal cell impedances that can become undesirably large when Lipon TFBs are operated below 0° C., and in particular when employed in the −40° C. range, such as required in military or aerospace applications and by other government agencies. This characteristic is due to the bulk ionic conductivity of the Lipon electrolyte and its charge transfer resistances at both the cathode and the anode interface becoming undesirably large at low temperatures. The inverse of the internal cell impedance, the current rate capability of a cell, for instance, may be rated at 50 mA at 25° C. in the 4.2-2.0V voltage window for a standard single-cell 1 in$^2$ TFB while increasing to more than 2000 mA for a few seconds at 100° C., but may be limited to 0.3 mA at −40° C.

From these performance data points, there exists a need to equip TFBs with an alternative, improved solid-state lithium-ion thin-film electrolyte. Particularly, there is a need for an electrolyte that possesses an equal or better electrochemical stability than Lipon versus highly reducing and oxidizing electrodes while providing a substantially enhanced low temperature performance.

SUMMARY OF THE INVENTION

The solid-state thin-film electrolyte of the present invention preferably exhibits, for example when compared to Lipon, an equal or larger electrochemical stability window (0-5.5 V vs. $Li^+/Li$), an equal or smaller electronic conductivity ($10^{-14}$ S/cm at 25° C.), the same ideal transference number for $Li^+$ ions (t=1.000), and an equal or higher $Li^+$ ion conductivity over the entire envisioned operation range of the battery (−50° C. to +200° C.).

In one embodiment of the present invention, a solid-state, inorganic electrolyte with glassy or amorphous morphology shows a lithium-ion conductivity of greater than $5*10^{-6}$ S/cm at 25° C. and has a chemical composition comprising at least the elements lithium, oxygen, nitrogen, and at least one element selected from the group of aluminum, silicon, phosphorus, sulfur, scandium, yttrium, lanthanum, zirconium, magnesium, and calcium. In a further embodiment, this electrolyte may be chemically stable in contact with metallic lithium. The electrolyte may also be chemically stable in contact with positive cathode materials that are charged to at least +3.9V versus a metallic lithium reference electrode.

In another embodiment, the electrolyte may comprise a thickness of less than 5 μm. In a further embodiment, the electrolyte may comprise a change in chemical composition between one electrolyte interface and the opposing other.

In another embodiment of the present invention, a method for fabricating, by physical vapor deposition (PVD), a solid-state, inorganic electrolyte is described. The method may be utilized to fabricate an electrolyte with glassy or amorphous morphology with lithium ion conductivity of greater than $5*10^{-6}$ S/cm at 25° C. and a chemical composition comprising at least the elements lithium, oxygen, nitrogen, and at least one element selected from the group of aluminum, silicon, phosphorus, sulfur, scandium, yttrium, lanthanum, zirconium, magnesium, and calcium. The method may further comprise changing the chemical composition of the electrolyte from one electrolyte interface to the other.

In another embodiment of the present invention, a specific glassy or amorphous electrolyte with the composition $Li_3(Sc_{2-x}M_x)(PO_{4-y}N_z)_3$ wherein M=Al and/or Y, $x \leq 2$, $z \leq 8/3$, and $2y=3z$ is provided, as described herein in greater detail below.

In yet another embodiment of the present invention, a specific glassy or amorphous electrolyte with the composition $Li_{8.3.5x}P_{1.5x}Zr_{1-x}O_{6-y}N_z$ wherein $x \leq 0.8$, $z \leq 4$, and $2y=3z$ is provided, as described herein in greater detail below.

In yet another embodiment of the present invention, a specific glassy or amorphous electrolyte with the composition $Li_{8-3x}La_xZrO_{6-y}N_z$ wherein $0 < x \leq 2$, $z \leq 4$, $2y=3z$ is provided, as described herein in greater detail below.

In yet another embodiment of the present invention, a specific glassy or amorphous electrolyte with the composition $Li_{6-0.75x}P_{1.75x}Zr_{2-2x}O_{7-7}N_z$ wherein $x \leq 0.8$, $z \leq 14/3$, and $2y=3z$ is provided, as described herein in greater detail below.

In yet another embodiment of the present invention, a specific glassy or amorphous electrolyte with the composition $Li_{3-3x}P_{1-x}Al_xO_{4-4x-y}N_{x+z}$ wherein $0 < x \leq 0.6$, $y \leq 1.6$, and $2y=3z$ is provided, as described herein in greater detail below.

It is to be understood that both the foregoing general description and the following detailed description are exemplary and explanatory only and are not restrictive of the invention, as claimed.

DETAILED DESCRIPTION OF THE INVENTION

It is to be understood that the present invention is not limited to the particular methodology, compounds, materials, manufacturing techniques, uses, and applications described herein, as these may vary. It is also to be understood that the terminology used herein is used for the purpose of describing particular embodiments only, and is not intended to limit the scope of the present invention. It must be noted that as used herein and in the appended claims, the singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. Structures described herein are to be understood also to refer to functional equivalents of such structures.

All patents and other publications identified are incorporated herein by reference for the purpose of describing and disclosing, for example, the methodologies described in such publications that might be used in connection with the present invention. These publications are provided solely for their disclosure prior to the filing date of the present application. Nothing in this regard should be construed as an admission that the inventors are not entitled to antedate such disclosure by virtue of prior invention or for any other reason.

A wide electrochemical stability window can preferably be achieved when basing the chemical composition of the electrolyte of the present invention on a group of principal materials that are known to be either thermodynamically stable with, or least kinetically inert against (in other words, a reaction does not occur due to the existence of a large enough activation energy hindrance between the reaction candidates), metallic lithium or highly oxidizing environments or, most preferably, against both. Then, these base materials may be subjected to a combinatorial chemistry screening, that is, specific compositions of PVD fabricated multinary-element electrolyte compositions, and perhaps also multinary phases, of the principal group materials may be tested electrochemically in asymmetric polarization cells (Li/electrolyte/polarizable metal electrode) using the Hebb-Wagner method (see, for instance, Neudecker et al., 143 J. Electrochem. Soc. 2198 (1996) and Yu et al., 144 J. Electrochem. Soc. 524 (1997)) and cyclic voltammetry (see, for instance, Appetecchi et al., 145 J. Electrochem. Soc. 4126 (1998) and Abraham et al., 147 J. Electrochem. Soc. 1251 (2000)).

The PVD combinatorial chemistry screening may be easily and inexpensively accomplished by employing, for example, a magnetron sputter target (sputter-up configuration) that may be composed of a selected and readily available principal material, for instance $Li_3PO_4$, upon which flat pressed powder pellets of one or more different principal materials are placed. The so-constructed multinary element target may then be magnetron-sputtered, which will deposit a specific multinary film composition onto a given substrate.

The group of preferred principal materials comprise, but are not limited to, $Li_5AlO_4$, $Li_4SiO_4$, $Li_2SiO_3$, $Li_3PO_4$, $Li_2SO_4$, $LiScO_2$, $LiYO_2$, $LiLaO_2$, $Li_6Zr_2O_7$, $Li_8ZrO_6$, $Al_2O_3$, $SiO_2$, $P_2O_5$, $Y_2O_3$, $La_2O_3$, $ZrO_2$, $Li_2O$, MgO, and CaO (cf., Neudecker et al., 143 J. Electrochem. Soc. 2198 (1996)). The PVD deposition of these materials may preferably result in predominantly glassy or amorphous thin films (e.g., materials that exhibit a crystallinity/crystallographic long-range order of about 0-100 Å or more) whose composition may be further modified and fine-tuned by the introduction of, for example, preferably, nitride doping through variations in the sputter atmosphere, such as, for instance, sputtering in $Ar/N_2$ mixtures.

To maximize the power performance of a thin cell battery, it is preferred to keep the internal cell resistance as small as possible. Thickness of the thin-film electrolyte is one factor that can contribute to internal cell resistance. For example, the internal cell resistance of a Lipon cell at 25° C. increases by at least a factor of three when going from 1 μm Lipon to 5 μm Lipon. Thus, it is preferable to have an electrolyte layer of a minimum thickness. In addition, thin-film layers are fairly cost-sensitive compared to battery materials/layers fabricated by wet chemistry, such as the cell phone batteries.

An electrolyte in a TFB may, for example, preferably be only about 1 μm thick. Due to this thinness, particularly in a TFB that is, for example, equipped with a metallic lithium anode, the electrolyte is preferably not crystalline or exhibit any substantial grain boundary morphology. Such a condition may allow or potentially cause metallic lithium anode material to creep along the electrolyte grain boundaries and eventually reach the cathode, thereby resulting in a short-circuit within the TFB. The reason for this potential creep tendency of metallic lithium along the grain boundaries of the electrolyte lies in the higher impurity concentration and off-composition in those electrolyte locations with which the metallic lithium partially reacts while forming pathways for additional metallic lithium to follow. This creep phenomenon is analogous to dendrite growth in liquid or polymeric electrolyte technology.

Although some embodiments of the present invention contain a single-phase electrolyte material that preferably can withstand direct contact (i.e, among other things, avoid the creeping problem discussed above) to both the highly reducing anode and the highly oxidizing cathode in high-performance TFBs, other embodiments contain a gradiented or stepped thin-film electrolyte composition to serve this purpose. This gradiented or stepped electrolyte may be designed to be stable with, or inert against, metallic lithium at the anode interface while gradienting or step-changing its composition in a suitable manner along its thickness axis, thereby rendering it stable with, or inert against, a highly oxidizing cathode such as, for example, one that is charged to at least +3.9V in comparison to a metallic lithium reference electrode. The gradienting or composition stepping may be accomplished, for example, through sputter depositing the thin-film electrolyte either from one sputter target by changing the sputter gas composition or by using more than one sputter targets over which the growing thin-film electrolyte is placed in a sequential or alternating manner. Relative to the finished electrolyte film, the gradiented principle was realized by Eveready (Jones et al., 53-56 Solid State Ionics 628 (1992)) and ORNL (Bates, U.S. Pat. No. 5,314,765 (1994)) by interposing a protection layer between the reducing anode and the solid state electrolyte, which could be considered an electrolyte with different interface compositions.

A further, in certain circumstances, relatively important or useful property of the electrolyte of the present invention is, for example, its potential increased $Li^+$ ion conductivity compared to Lipon. This increased $Li^+$ ion conductivity may provide TFBs with a much improved low temperature power performance. The theory for solid-state lithium-ion electrolytes was mainly developed between about 1970-1995; the latter date being associated with the introduction of the Lipon electrolyte into TFBs. In this time frame, papers on entirely inorganic, solid-state Li$^+$ ion electrolytes from A. R. West, R. A. Huggins, C. C. Liang, P. Hagenmuller, J. B. Bates, and M. Greenblatt (to name a few) taught certain techniques for building those electrolytes and how to change the parameters of the Li$^+$ ion conductivity, which in turn is given by $$\sigma_{Li+} = A/T^* \exp(-E_a/RT)$$

wherein $\sigma_{Li+}$ is the Li$^+$ ion conductivity at a given temperature T[K], R represents the gas constant while the factor A denotes the pre-exponential factor, a measure for the theoretically maximally achievable Li$^+$ ion conductivity. This conductivity would be realized if the activation enthalpy for Li$^+$ ion conduction, $E_a$ (chemical barrier inside the electrolyte network for Li$^+$ ion conduction), did not exist in the solid-state glass (or crystalline) network of the electrolyte, which then under TFB operation would allow all Li$^+$ ion jump attempts from one electrolyte network site to another to become successful.

In the instant thin-film electrolyte compositions of certain embodiments, the activation enthalpy for Li$^+$ ion conduction $E_a$ may be reduced by adequate electrolyte network vacancy and interstitial doping approaches (e.g., aliovalent doping of Li$_3$PO$_4$ with Li$_4$SiO$_4$) as well as by reducing the pinning electrostatic forces (e.g., replacing some of the more electronegative oxide ions by less electronegative nitride ions, as very successfully realized in Lipon over Li$_3$PO$_4$) that the Li$^+$ ion encounters when moving through the electrolyte network. Because all sputter deposited thin-film electrolyte compositions may, in certain embodiments, be expected to be glassy or amorphous in their as-fabricated state, which by definition is more disordered than their crystalline counterparts, a substantial Li$^+$ ion conductivity boost may be anticipated, as previously demonstrated for crystalline Li$_3$PO$_4$ (Y-W. Hu et al., 11 Materials Research Bulletin, 1227 (1976)) versus sputter deposited glassy Li$_3$PO$_4$ (Bates et al., 53-56 Solid State Ionics, 647 (1992)).

The additional desirable properties, a low electronic conductivity, a high temperature stability, and a transference number of unity, are preferably given by the specific choice of the principal materials listed above, because they are preferably (i) high-temperature compounds, and so are their multinary derivatives, such as Li$_4$SiO$_4$ doped Li$_3$PO$_4$, (ii) strong electronic insulators, and (iii) composed of highly charged, and thus immobile ions except for the singly charged, small and thus very mobile Li$^+$ ion, which, for example, results in the Li$^+$ ion being the only mobile species in the electrolyte network, which in turn leads to a Li$^+$ ion transference number of unity.

As mentioned above, the charge transfer resistances to both the anode and cathode may contribute substantially to the overall cell impedance. One exemplary approach regarding how to limit these cell impedance contributors to a minimum may be to maximize the contact area at the thin-film electrolyte interfaces by optimizing the thin-film deposition process of both the thin-film electrolyte onto the cathode and subsequently the anode deposition process onto the thin-film electrolyte surface.

Previously crystalline Li$_3$(Sc$_{2-x}$M$_x$)(PO$_4$)$_3$ (M=Al$^{3+}$, Y$^{3+}$) was found to potentially exhibit Li$^+$ ion conductivities in excess of 10$^{-5}$ S/cm at room temperature for x=0.4, which is approximately more than five times the Li$^+$ ion conductivity of Lipon (Amatucci et al., Solid State Ionics 60 (1993) 357). Through sputter depositing Li$_3$(Sc$_{2-x}$M$_x$)(PO$_4$)$_3$ (M=Al$^{3+}$, Y$^{3+}$), a glassy or amorphous morphology of this electrolyte material may be achieved, which may be beneficial when using it in thin film batteries in conjunction with the metallic lithium anode as explained above while, in addition, the glassiness alone may increase the Li$^+$ ion conductivity of the electrolyte by more than one order of magnitude. In certain embodiments, doping the composition with nitride ions that may replace some of the oxygen ions in the glass network may enhance the Li$^+$ ion conductivity of the thin-film electrolyte through reduction of the activation enthalpy for Li$^+$ ion conduction $E_a$, in addition to rendering the electrolyte material more stable with, or inert against, a metallic lithium anode. Although the use of a single-piece sputter target of this 5 to 7 element material may be preferred, one may sputter deposit from a suitable sputter target in reactive N$_2$ atmosphere, with or without any additional admixed gases such as, for instance, argon. A suitable sputter target may be a readily available Li$_3$PO$_4$ sputter target onto whose sputter surface a specific number of pressed powder pellets of Al$_2$O$_3$, Sc$_2$O$_3$, and Y$_2$O$_3$ of a given footprint are located in order to attain the desired film composition and electrochemical properties in the Li—Sc—Al—Y—P—O—N system. The resulting, so—deposited, typically glassy, thin-film electrolyte may be described to have the composition Li$_3$(Sc$_{2-x}$M$_x$)(PO$_{4-y}$N$_z$)$_3$ wherein M=Al and/or Y, x≦2, z≦8/3, and 2y=3z.

In another embodiment of the present invention, the parent compound Li$_8$ZrO$_6$ (cf., e.g., Scholder et al., Zeitschrift für Anorganische and Allgemeine Chemie, Band 362 (1968) 149; Delmas et al., Materials Research Bulletin 14 (1979) 619; Ohno et al., Journal of Nuclear Materials 132 (1985) 222), which is stable against both metallic lithium and high oxidation environments, that is, high positive voltages against a lithium reference electrode, may be aliovalently doped at the cation and anion positions in order to substantially enhance its lithium ionic conductivity. Preferred doping materials comprise Li$_3$PO$_4$, which can formally be rewritten as "Li$_{4.5}$P$_{1.5}$O$_6$", and nitrogen, wherein the latter replaces some of the oxide ions in the so-doped, final compound whose composition may be described as (1-x)Li$_8$ZrO$_6$*xLi$_{4.5}$P$_{1.5}$O$_6$:N or, more precisely, Li$_{8-3.5x}$P$_{1.5x}$Zr$_{1-x}$O$_{6-y}$N$_z$ wherein x≦0.8, z≦4, and 2y=3z.

The nitrogen doping may be accomplished in a thin-film electrolyte that may be fabricated through a reactive sputter deposition from a sputter target material of the composition (1-x) Li$_8$ZrO$_6$*xLi$_{4.5}$P$_{1.5}$O$_6$ in a reactive N$_2$ atmosphere, with or without any additional admixed gases such as, for instance, argon. This film may be glassy or amorphous and therefore exhibit no substantial grain boundaries, which is the preferred morphology for some embodiments of the thin-film electrolytes as explained above.

Instead of the Li$_3$PO$_4$ doping approach from above, which aliovalently doped the parent compound at the high-valence position, the zirconium position, one may aliovalently dope Li$_8$ZrO$_6$ at the lithium position with, for instance, lanthanum, thereby arriving at chemical compositions that may be described by Li$_{8-3x}$La$_x$ZrO$_{6-y}$N$_z$ wherein z≦4, 2y=3z, and preferably 0<x≦2.

The nitrogen doping may be accomplished in a thin-film electrolyte that may be fabricated through a reactive sputter deposition from a sputter target material of the composition Li$_{8-3x}$La$_x$ZrO$_6$ in a reactive N$_2$ atmosphere, with or without any additional admixed gases such as, for instance, argon. This film may be glassy or amorphous and therefore exhibit no substantial grain boundaries, which is the preferred morphology for thin-film electrolytes as explained above.

The substantially glassy or amorphous compound of the present invention Li$_{8-3x}$La$_x$ZrO$_{6-y}$N$_z$ wherein z<4, 2y=3z, and preferably $0<x\leq2$ that does not show substantial grain boundaries and thus differs substantially from the specific crystalline Garnet compounds that Weppner et al. describes in WO 2005/085138 A1 US 2007/0148553, and DE 10 2007 030 604 A1. These crystalline Garnet compounds may not be used in thin-film batteries wherein the thin-film electrolyte may be thinner than or equal to 5 μm. Otherwise, specifically lithium from the anode may creep along the crystalline grain boundaries of this rather thin electrolyte layer and eventually create an electronic leakage current path or even short-circuit with the cathode, resulting in destruction of the thin-film battery. Furthermore, PVD deposited oxide and oxy-nitride films of the present invention typically deposit in glassy or amorphous morphology so that an undesirable heat treatment would be necessary to crystallize these films, which in itself, however, is undesirable for the reasons given above. Notwithstanding the undesired crystalline morphology for thin-film electrolytes, a crystallizing heat treatment may additionally cause an unwanted chemical reaction of the electrolyte with the anode and/or cathode. As previously discussed, crystalline thin-film electrolyte films have numerous drawbacks that are preferably to be avoided. On the other hand, PVD processes, such as magnetron sputter deposition, lead to glassy or amorphous thin-film electrolytes that may not need any further heat treatment but, in view of best TFB operation, may already be their preferred morphological state immediately after their fabrication.

In yet another embodiment of the present invention one may use a related lithium zirconium oxide as a starting compound, such as $Li_6Zr_2O_7$ (cf. Abrahams et al., Journal of Solid State Chemistry 104 (1993) 197), which could be considered to formally consist of $3Li_2O*2ZrO_2$ or $(1.5Li_2O*ZrO_2)_2$, which therefore possesses only 1.5/4 or 38% of the formal $Li_2O$ residing in $Li_8ZrO_6$, which in turn may formally be described as $4Li_2O*ZrO_2$. When doped with $Li_3PO_4$ and nitrogen, we obtain compounds whose formulae can be represented by $Li_{6-0.75x}P_{1.75x}Zr_{2-2x}O_{7-y}N_z$ wherein $z\leq14/3$, $2y=3z$, and preferably $x\leq0.8$.

Nitrogen doping may be accomplished in a thin-film electrolyte that may be fabricated through a reactive sputter deposition from a sputter target material of the composition $Li_{6-0.75x}P_{1.75x}Zr_{2-2x}O_7$ in a reactive $N_2$ atmosphere, with or without any additional admixed gases such as, for instance, argon. This film may be glassy or amorphous and therefore exhibit no substantial grain boundaries, which is the preferred morphology for thin-film electrolytes as explained above.

Yet another embodiment of the present invention relates to AlN doped $Li_3PO_4$, which introduces vacancies at the $Li^+$ ion cation position and the oxygen anion position while replacing some of the $Li^+$ ion pinning, electron rich oxygen ions and their 2p atomic orbitals with the less $Li^+$ ion pinning, less electron rich, 2p nitrogen orbitals, according to the formula $Li_{3-3x}P_{1-x}Al_xO_{4-4x}N_x$ wherein preferably $0<x\leq0.6$.

Sputtering AlN doped $Li_3PO_4$ material, for instance, in a reactive $N_2$ atmosphere, with or without any additional admixed gases such as, for instance, argon, may allow the fabrication of an electrolyte film that is further doped with nitrogen and may be described by a composition of $Li_{3-3x}P_{1-x}Al_xO_{4-4x-y}N_{x+z}$ wherein preferably $0<x\leq0.6$, $y\leq1.6$, and $2y=3z$. This film may be glassy or amorphous and therefore exhibit no substantial grain boundaries, which is the preferred morphology for thin-film electrolytes as explained above.

All of the various compositions of the thin-film electrolyte of the present invention are thermally stable up to at least 150° C. while some specific compositions may be thermally stable well above 300° C. or even above 500° C. This thermal property may allow the use of the thin-film electrolyte of the present invention in TFBs that are exposed to higher (up to 150° C.) to high (above 150° C.) temperature environments for extended periods of time, such as days or even months or years. It is to be understood, however, that the thermal stability of a TFB is not solely dependent on the thermal stability of the electrolyte but may also be determined by, for instance, the thermal stability of the packaging of the TFB or the state of charge of the positive cathode material when exposed to higher or high temperatures.

EXAMPLES

Example 1

In a particular embodiment of the present invention, the $Li^+$ ion conductivity of the electrolyte is demonstrated in a conductivity test cell using two sandwiching inert metal electrodes. The electrolyte exhibits an improved activation enthalpy $E_a$ of less than 0.5 eV (compared to Lipon $E_a$=0.514 eV) that leads to a $Li^+$ ion conductivity of greater than $5*10^{-6}$ S/cm at 25° C. The electrolyte possesses a $Li^+$ ion conductivity at 0° C. of $1.48*10^{-6}$ S/cm, which is five times higher than that of Lipon ($2.95*10^{-7}$ S/cm) and ten times higher ($8.1*10^{-8}$ S/cm) at −40° C. (Lipon: $8.1*10^{-9}$ S/cm). The electrolyte of the present invention has at least an electrochemical stability window from 0-5.5V vs. $Li^+/Li$ before the electrolyte breaks down and shows a substantial electronic conductivity of more than $1*10^{-6}$ S/cm.

Example 2

In a further embodiment, a 1 $in^2$ large TFB fabricated with the electrolyte of the present invention supplies 700 μAh at ½ C rate at 25° C. in the voltage range 4.2-2.0V and delivers 250 μAh at 100 mA (140 C rate) at the same temperature and within the same voltage window. This TFB is fabricated onto 50 μm metal foil substrate, which also serves as the positive terminal, together with 0.5 μm conductive barrier layer, 3.5 μm $LiCoO_2$ positive cathode, 1.2 μm electrolyte of the present invention, ~9 μm Li anode, and a standard metal foil encapsulation.

Example 3

A further embodiment of the present invention encompasses fabricated TFBs that supply 700 μAh at ½ C rate at 25° C. in the voltage range 4.2-2.0V and are capable of delivering a continuous current of 0.4 mA within the same voltage window but at −40° C.

Example 4

The thin-film electrolyte of the composition $Li_3(ScAl)(PO_{3.4}N_{0.4})_3$, formally comprising $Li_3PO_4*P_2O_{5*1/2}Sc_2O_{3*1/2}Al_2O_3$:N, is fabricated in a RF magnetron sputter deposition using "sputter-up" configuration in an 10 mTorr $N_2$ reactive atmosphere onto a graphite substrate by employing a 4 inch diameter $Li_3PO_4$ sputter target whose sputter surface is covered by approximately 33% with about 2 mm thick and about 1 $cm^2$ in diameter large, pressed and sintered powder pellets of $P_2O_5$, by approximately 17% with about 2 mm thick and about 1 $cm^2$ in diameter large, pressed and sintered powder pellets of $Al_2O_3$, and by approximately 17% with about 2 mm thick and about 1 $cm^2$ in diameter large, pressed and sintered powder pellets of $Sc_2O_3$. The resulting, deposited thin-film electrolyte film at a distance of 7.5 cm from the $Li_3PO_4$ target surface is XRD amorphous and may be analyzed by quantitative EDS and/or quantitative RBS to exhibit a Sc:Al:P:O:N stoichiometric ratio of 1:1:1:3.4:0.4. The stoichiometric factor of lithium may be obtained via back-calculation using the chemical electro-neutrality rule and the known formal valence states of Li(+1), Sc(+3), Al(+3), P(+5), O(−2), and N(−3).

Example 5

The thin-film electrolyte of Example 4 may be heat treated in an inert argon atmosphere continuously at 150° C. for 7 days without substantially changing its Li:Sc:Al:P:O:N stoichiometric ratio of 3:1:1:1:3.4:0.4.

The embodiments described above are exemplary only. One skilled in the art may recognize variations from the embodiments specifically described here, which are intended to be within the scope of this disclosure. As such, the invention is limited only by the following claims. Thus, it is intended that the present invention cover the modifications of this invention provided they come within the scope of the appended claims and their equivalents. Further, specific explanations of theories regarding the formation or performance of electrochemical devices according to the present invention are presented for explanation only and are not to be considered limiting with respect to the scope of the present disclosure or the claims.

What is claimed is:

1. A solid-state, inorganic, electrolyte comprising:
a chemical composition described by $Li_3(Sc_{2-x}M_x)(PO_{4-y}N_z)_3$ wherein $x \leq 2$, $0 < z \leq 8/3$, $2y = 3z$, and M is selected from the group of Al, Y, and $Al_{1-a}Y_a$ wherein a <1.

2. A solid-state, inorganic, electrolyte comprising:
a chemical composition described by $Li_{8-3.5x}P_{1.5x}Zr_{1-x}O_{6-y}N_z$ wherein $x \leq 0.8$, $z \leq 4$, and $2y = 3z$.

3. A solid-state, inorganic, electrolyte comprising:
a chemical composition described by $Li_{8-3x}La_xZrO_{6-y}N_z$ wherein $0 < x \leq 2$, $z \leq 4$, and $2y = 3z$.

4. A solid-state, inorganic, electrolyte comprising:
a chemical composition described by $Li_{6-0.75x}P_{1.75x}Zr_{2-2x}O_{7-y}N_z$ wherein $x \leq 0.8$, $z \leq 14/3$, and $2y = 3z$.

5. A solid-state, inorganic, electrolyte comprising:
a chemical composition described by $Li_{3-3x}P_{1-x}Al_xO_{4-4x-y}N_{x+z}$ wherein $0 < x \leq 0.6$, $y < 1.6$, and $2y = 3z$.

6. The electrolyte of claim 1, wherein said electrolyte has a crystallinity of about 0-100 Å, and has a lithium ion conductivity of greater than $5*10^{-6}$ S/cm at 25° C.

7. The electrolyte of claim 1, further comprising at least one element selected from the group of silicon, sulfur, lanthanum, zirconium, magnesium, and calcium.

8. The electrolyte of claim 2, wherein said electrolyte has a crystallinity of about 0-100 Å, and has a lithium ion conductivity of greater than $5*10^{-6}$ S/cm at 25° C.

9. The electrolyte of claim 2, further comprising at least one element selected from the group of aluminum, silicon, sulfur, scandium, yttrium, lanthanum, magnesium, and calcium.

10. The electrolyte of claim 3, wherein said electrolyte has a crystallinity of about 0-100 Å, and has a lithium ion conductivity of greater than $5*10^{-6}$ S/cm at 25° C.

11. The electrolyte of claim 3, further comprising at least one element selected from the group of aluminum, silicon, phosphorus, sulfur, scandium, yttrium, magnesium, and calcium.

12. The electrolyte of claim 4, wherein said electrolyte has a crystallinity of about 0-100 Å, and has a lithium ion conductivity of greater than $5*10^{-6}$ S/cm at 25° C.

13. The electrolyte of claim 4, further comprising at least one element selected from the group of aluminum, silicon, sulfur, scandium, yttrium, lanthanum, magnesium, and calcium.

14. The electrolyte of claim 5, wherein said electrolyte has a crystallinity of about 0-100 Å, and has a lithium ion conductivity of greater than $5*10^{-6}$ S/cm at 25° C.

15. The electrolyte of claim 5, further comprising at least one element selected from the group of silicon, sulfur, scandium, yttrium, lanthanum, zirconium, magnesium, and calcium.

16. The electrolyte of claim 5 further adapted to be substantially kinetically inert with a metallic lithium anode.

17. The electrolyte of claim 5 further adapted to be substantially kinetically inert with a positive cathode charged to a potential of about +3.9V, said potential measured in comparison to a metallic lithium reference electrode.

18. The electrolyte of claim 5 further adapted to be substantially thermally stable at ambient temperatures up to about 150° C.

19. The electrolyte of claim 5 further adapted to be substantially kinetically inert with metallic lithium at ambient temperatures of up to about 150° C.

20. The electrolyte of claim 5 further adapted to be substantially kinetically inert with positive cathode materials that are charged to a potential of about +3.9V at ambient temperatures of up to about 150° C., said potential measured in comparison to a metallic lithium reference electrode.

21. The electrolyte of claim 5 further comprising a thickness of said electrolyte of less than about 5 μm.

22. The electrolyte of claim 5 wherein said electrolyte further comprises:
a first electrolyte-electrode interface, and
a second electrolyte-electrode interface,
wherein said first and second electrolyte-electrode interfaces have different chemical compositions.

* * * * *

UNITED STATES PATENT AND TRADEMARK OFFICE
CERTIFICATE OF CORRECTION

PATENT NO. : 8,268,488 B2
APPLICATION NO. : 12/358762
DATED : September 18, 2012
INVENTOR(S) : Bernd J. Neudecker et al.

It is certified that error appears in the above-identified patent and that said Letters Patent is hereby corrected as shown below:

At column 9, claim number 1, line number 30, change "$\leqq$" to --$\leq$--, every occurrence.

At column 9, claim number 2, line number 34, change "$\leqq$" to --$\leq$--, every occurrence.

At column 9, claim number 3, line number 37, change "$\leqq$" to --$\leq$--, every occurrence.

At column 9, claim number 4, line number 40, change "$\leqq$" to --$\leq$--, every occurrence.

At column 9, claim number 5, line number 43, change "$\leqq$" to --$\leq$--, every occurrence.

Signed and Sealed this
Fifth Day of February, 2013

Teresa Stanek Rea
*Acting Director of the United States Patent and Trademark Office*